(12) United States Patent
Sugiyama

(10) Patent No.: US 11,961,909 B2
(45) Date of Patent: Apr. 16, 2024

(54) SEMICONDUCTOR DEVICE INCLUDING A MISFET AND METHOD OF MANUFACTURING THE SAME

(71) Applicant: RENESAS ELECTRONICS CORPORATION, Tokyo (JP)

(72) Inventor: Hideki Sugiyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 35 days.

(21) Appl. No.: 17/686,042

(22) Filed: Mar. 3, 2022

(65) Prior Publication Data

US 2023/0282745 A1 Sep. 7, 2023

(51) Int. Cl.
| | |
|---|---|
| *H01L 29/78* | (2006.01) |
| *H01L 21/265* | (2006.01) |
| *H01L 21/266* | (2006.01) |
| *H01L 29/08* | (2006.01) |
| *H01L 29/10* | (2006.01) |
| *H01L 29/66* | (2006.01) |

(52) U.S. Cl.
CPC .... *H01L 29/7836* (2013.01); *H01L 21/26513* (2013.01); *H01L 21/266* (2013.01); *H01L 29/0847* (2013.01); *H01L 29/6659* (2013.01)

(58) Field of Classification Search
CPC ............. H01L 29/6659; H01L 29/7833; H01L 29/66598; H01L 29/7836; H01L 21/823814; H01L 21/26586; H01L 29/66492; H01L 29/0692; H01L 29/1083; H01L 29/0847
See application file for complete search history.

(56) References Cited

U.S. PATENT DOCUMENTS

| | | | |
|---|---|---|---|
| 5,733,792 A | 3/1998 | Masuoka | |
| 7,144,782 B1 * | 12/2006 | Ehrichs | ............... H01L 29/7833 257/E21.345 |
| 2009/0159967 A1 * | 6/2009 | Edwards | ............. H01L 29/7833 257/E29.256 |
| 2009/0170259 A1 * | 7/2009 | Hornung | ......... H01L 21/823814 438/525 |
| 2010/0244130 A1 * | 9/2010 | Bulucea | .......... H01L 21/823814 257/E21.417 |
| 2011/0266635 A1 * | 11/2011 | Ekbote | .............. H01L 21/26586 257/408 |

(Continued)

FOREIGN PATENT DOCUMENTS

JP 09-45906 A 2/1997

*Primary Examiner* — Sonya McCall-Shepard
(74) *Attorney, Agent, or Firm* — Rimon P.C.

(57) ABSTRACT

Semiconductor device includes a well region formed in an active region of a semiconductor substrate, a gate electrode formed on the well region via a gate dielectric film, and a source region and a drain region formed in the well region. At the vicinity of both end portions of the active region in the first direction, a first region and a second region having the same conductivity type as the well region and having impurity concentration higher than that of the well region are formed in the well region. The first region and the second region are spaced from each other in a second direction perpendicular to the first direction, and at least a portion of each of them is located under the gate electrode. The first region and the second region are not formed at the center portion of the active region in the first direction.

16 Claims, 27 Drawing Sheets

(56) References Cited

U.S. PATENT DOCUMENTS

| | | | |
|---|---|---|---|
| 2012/0098590 A1* | 4/2012 | Edwards | H01L 29/122 977/932 |
| 2014/0035049 A1* | 2/2014 | Yeh | H01L 27/088 438/302 |
| 2014/0197497 A1* | 7/2014 | Ito | H01L 21/823456 257/408 |
| 2016/0204223 A1* | 7/2016 | Xue | H01L 29/0692 438/294 |
| 2022/0189954 A1* | 6/2022 | Nandakumar | H01L 29/0847 |

* cited by examiner

SEMICONDUCTOR DEVICE INCLUDING A MISFET AND METHOD OF MANUFACTURING THE SAME

BACKGROUND

The present invention relates to a semiconductor device and a method of manufacturing the same, and the present invention can be suitably applied to, for example, a semiconductor device and method of manufacturing the same including a MISFET.

There are disclosed techniques listed below.
[Patent Document 1] Japanese Unexamined Patent Application Publication No. H9-045906

The Patent Document 1 describes a technique of forming a pocket region after forming a source/drain region.

SUMMARY

It is desirable to improve the performance of semiconductor device including MISFET.

Other objects and novel features will become apparent from the description of this specification and the accompanying drawings.

According to one embodiment, a semiconductor device includes a semiconductor substrate, a well region of a first conductivity type formed in an active region of the semiconductor substrate, a gate electrode formed on the well region of the semiconductor substrate via a gate dielectric film, and a source region and a drain region formed in the well region and having a second conductivity type opposite to the first conductivity type. The gate electrode extends in a first direction, and the source region and the drain region are spaced from each other in a second direction perpendicular to the first direction. The source region includes a first semiconductor region and a first high concentration region adjacent to the first semiconductor region and having an impurity concentration higher than that of the first semiconductor region. The drain region includes a second semiconductor region and a second high concentration region adjacent to the second semiconductor region and having an impurity concentration higher than that of the second semiconductor region. At the vicinity of both end portions of the active region in the first direction, a first region of the first conductivity type adjacent to the first semiconductor region and a second region of the first conductivity type adjacent to the second semiconductor region are formed in the well region. The first region and the second region are spaced from each other in the second direction, and have an impurity concentration than that of the well region. At least a portion of the first region and at least a portion of the second region are located under the gate electrode. In the center portion of the active region in the first direction, the first region and the second region are not formed.

DETAILED DESCRIPTION

Figure 1:
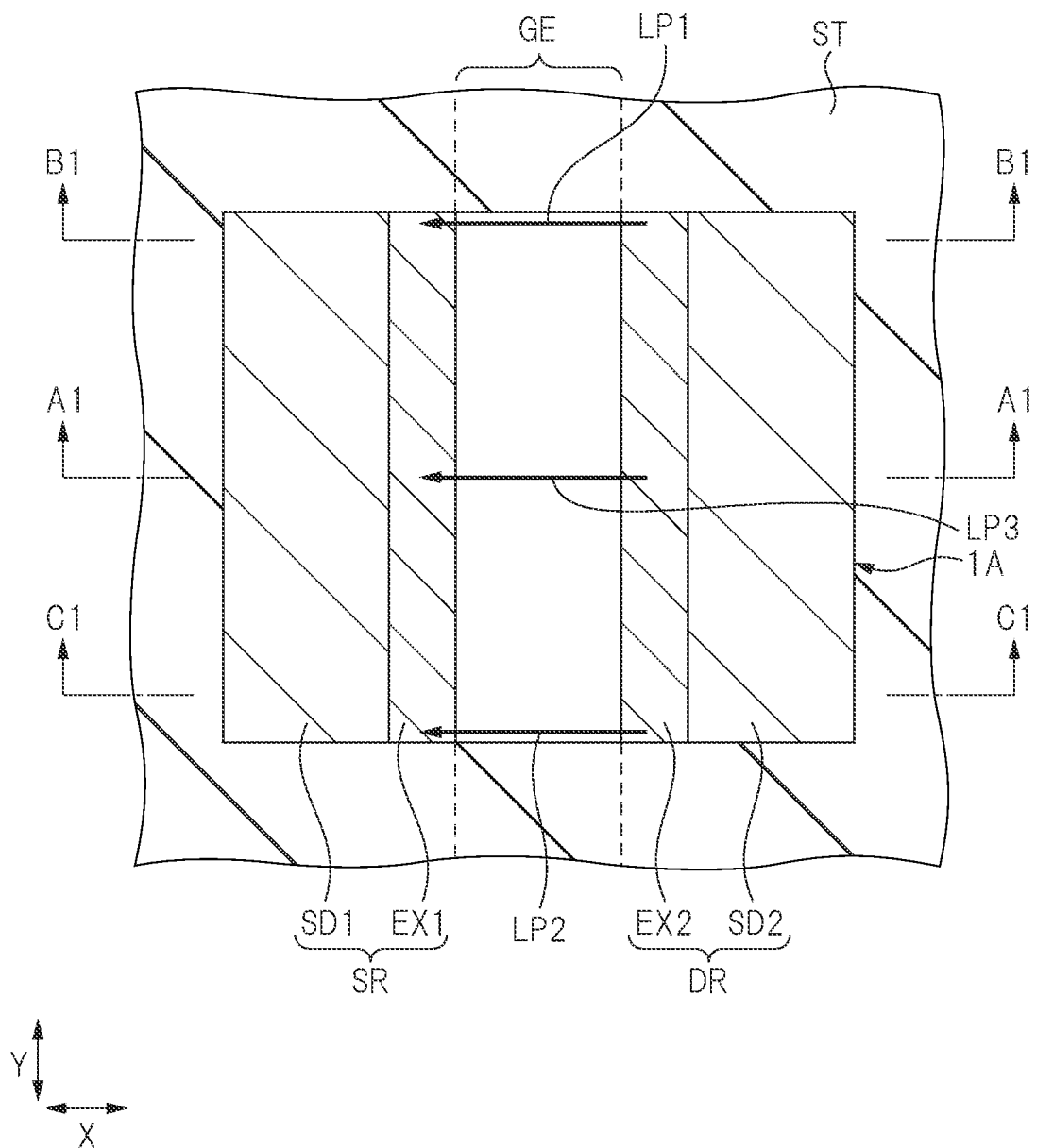
FIG. 1 is a main portion plan view of a semiconductor device of one embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail with reference to the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

First Embodiment

<Structure of Semiconductor Device>

Figure 2:
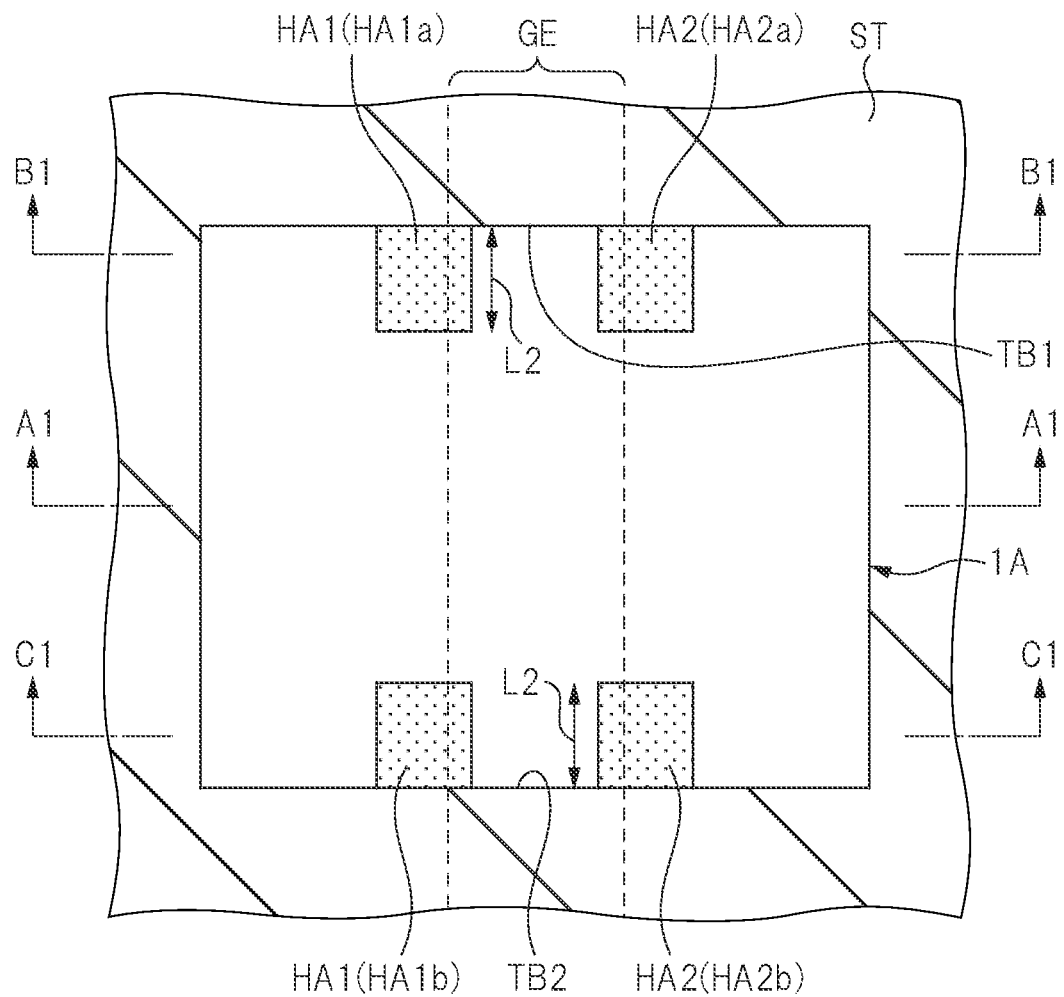
FIG. 2 is a main portion plan view of the semiconductor device of one embodiment.
Figure 3:
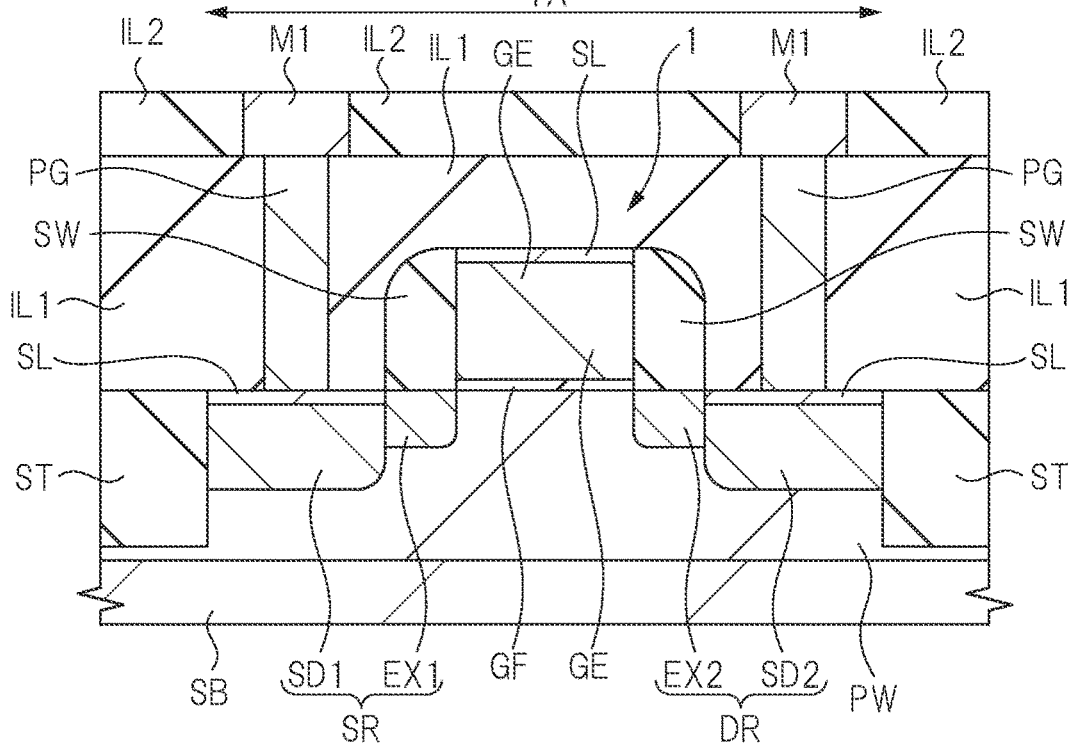
FIG. 3 is a main portion cross-sectional view of the semiconductor device of one embodiment.
Figure 4:
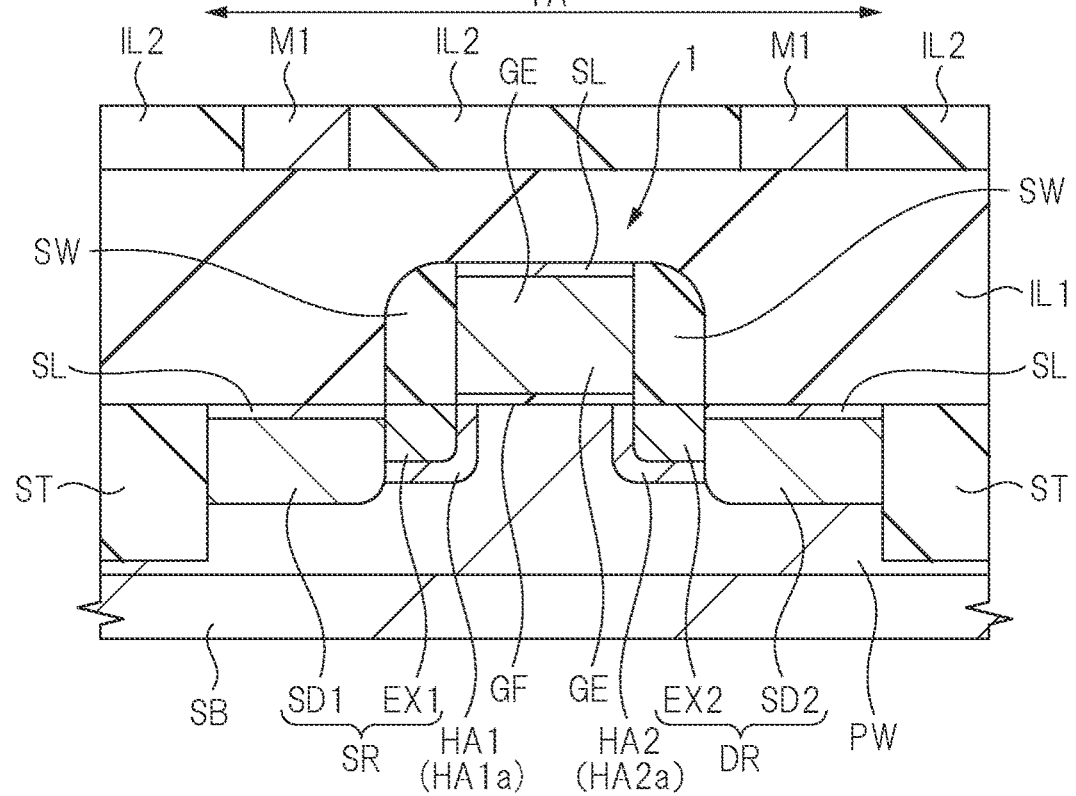
FIG. 4 is a main portion cross-sectional view of the semiconductor device of one embodiment.

FIGS. 1 and 2 are main portion plan views of a semiconductor device of present embodiment, and FIGS. 3 and 4 are main portion cross-sectional views of the semiconductor device of present embodiment. Cross-sectional view at the position of A1-A1 line in FIGS. 1 and 2 corresponds to FIG. 3, and cross-sectional view at the position of B1-B1 line in FIGS. 1 and 2 corresponds to FIG. 4. Cross-sectional view at the position of C1-C1 line in FIGS. 1 and 2 is the same as when the symbols H1$a$ and H2$a$ in FIG. 4 are replaced by the symbols H1$b$ and H2$b$, respectively. Incidentally, the X direction and the Y direction shown in FIGS. 1 and 2 are directions perpendicular to each other. Each of the X direction and the Y direction is a direction parallel to a main surface or a back surface of a semiconductor substrate SB, i.e., the horizontal direction. The X direction corresponds to the gate length direction of the gate electrode GE, and the Y direction corresponds to the gate width direction of the gate electrode GE. FIGS. 1 and 2 show the same planar regions, but for the sake of simplicity, the element isolation region ST, $n^-$ type semiconductor regions EX1, EX2, and $n^+$ type semiconductor regions SD1, SD2 are hatched in FIG. 1, and the position where the gate electrode GE is formed is indicated by dotted line and the regions where the p-type halo regions HA1, HA2 are formed are indicated by dotted lines in FIG. 2.

The semiconductor device of the present embodiment is a semiconductor device including a MISFET (Metal Insulator Semiconductor Field Effect Transistor) 1. MISFET 1 will also be described below as being an n-channel type transistor, but may also be a p-channel type transistor with the conductivity type reversed.

As shown in FIGS. 1 to 4, an element isolation region ST for isolating the elements is formed in a semiconductor substrate (semiconductor wafer) SB made of, for example, a p-type monocrystalline silicon having a specific resistance of about 1 to 10 Ωcm, and a MISFET formation region 1A that is a region (active region) in which a MISFET 1 is formed is defined by the element isolation region ST. The element isolation region ST is embedded in a trench of the main surface of the semiconductor substrate SB. The MISFET formation region 1A is surrounded by the element isolation region ST in a plan view. That is, MISFET formation region 1A corresponds to the region surrounded by the element isolation region ST in the semiconductor substrate SB. In FIGS. 1 and 2, the case where the planar shape of MISFET formation region 1A is a rectangular shape having a side substantially parallel to the X direction and a side substantially parallel to the Y direction is shown. Note that the plan view corresponds to when viewed in a plane substantially parallel to the main surface of the semiconductor substrate SB.

The element isolation region ST is formed by Shallow Trench Isolation (STI) method. Therefore, the element isolation region ST is made of an insulator (insulating film) embedded in the trench formed in the semiconductor substrate SB. The element isolation region ST is mainly made of silicon oxide. A p-type well (p-type well region) PW is formed in the semiconductor substrate SB in MISFET formation region 1A. The p-type well PW is a p-type semiconductor region into which a p-type impurity is implanted.

Hereinafter, the configuration of MISFET 1 will be described in detail by referring to FIGS. 1 to 4.

MISFET 1 includes a gate electrode GE formed on the semiconductor substrate SB (p-type well PW) via a gate dielectric film GF, and an n-type semiconductor regions SR, DR for the source-drain (source or drain) formed on both sides of the gate electrode GE in a plan view.

The gate dielectric film GF is made of an insulating film, for example, a silicon oxide film. The gate dielectric film GF is interposed between the semiconductor substrate SB and the gate electrode GE.

The gate electrode GE is made of a conductive film, for example, a silicon film. The silicon film is preferably a polysilicon film, and a doped polysilicon film into which an n-type impurity or a p-type impurity is implanted can also be used.

The gate electrode GE extends in the Y direction so as to cross MISFET formation region 1A in a plan view. Therefore, the gate electrode GE is continuously formed over the semiconductor substrate SB in MISFET formation region 1A and over the element isolation region ST around MISFET formation region 1A. However, the gate electrode GE may be in contact with the element isolation region ST, but not in contact with the semiconductor substrate SB of MISFET formation region 1A, and the gate dielectric film GF is interposed between the semiconductor substrate SB of MISFET formation region 1A and the gate electrode GE.

In the semiconductor substrate SB (p-type well PW) of MISFET formation region 1A, the region under the gate electrode GE is the region where the channel is formed, i.e., the channel formation region. The channel formation region is formed on a surface layer portion of the semiconductor substrate SB, and adjacent to the gate dielectric film GF present under the gate electrode GE.

On each of sidewalls of the gate electrode GE, a sidewall spacer SW is formed as a sidewall insulating film. The sidewall spacer SW is formed of an insulating film, but may be formed of a single film or a stacked film.

In plan view, a pair of n-type semiconductor region SR, DR is formed so as to sandwich the gate electrode GE in the X direction, one of the pair of n-type semiconductor region SR, DR (here, n-type semiconductor region SR) functions as a source region of MISFET 1, the other of the pair of n-type semiconductor region SR, DR (here, n-type semiconductor region DR) functions as a drain region of MISFET 1. The n-type semiconductor regions SR, DR are formed in the semiconductor substrate SB (p-type well PW) of MISFET formation region 1A.

Each of the n-type semiconductor regions SR, DR has a Lightly Doped Drain (LDD) structure. Therefore, n-type semiconductor region SR is formed of an $n^-$ type semiconductor region (extension region, LDD region) EX1 with low impurity concentration, and an $n^+$ type semiconductor region SD1 with higher impurity concentration than the $n^-$ type semiconductor region EX1. Further, n-type semiconductor region DR is formed of an $n^-$ type semiconductor region (extension region, LDD region) EX2 with low impurity concentration, and an $n^+$ type semiconductor region SD2 with higher impurity concentration than the $n^-$ type semiconductor region EX2. The $n^+$ type semiconductor region SD1 has higher n-type impurity concentration and deeper junction depth than the $n^-$ type semiconductor region EX1 is deep, and the $n^+$ type semiconductor region SD2 has higher n-type impurity concentration and deeper junction depth than the $n^-$ type semiconductor region EX2.

The $n^-$ type semiconductor regions EX1, EX2 are formed in a self-aligned manner by the gate electrode GE, and the $n^+$ type semiconductor region SD1, SD2 are formed in a self-aligned manner by the sidewall spacer SW provided on each of the sidewalls of the gate electrode GE. Therefore, the $n^-$ type semiconductor region EX1 is located under the sidewall spacer SW on one sidewall of the gate electrode GE, the $n^-$ type semiconductor region EX2 is located under the sidewall spacer SW on the other sidewall of the gate electrode GE, and the $n^-$ type semiconductor region EX1 and the $n^-$ type semiconductor region EX2 are spaced from each other with the channel formation region interposed therebetween (spaced in the X direction). Then, the high concentration $n^+$ type semiconductor regions SD1 SD2 are formed on the outside of the low concentration $n^-$ type semiconductor regions EX1, EX2 (the side away from the channel formation region). The $n^+$ type semiconductor region SD1 is spaced from the channel formation region by the $n^-$ type semiconductor region EX1 (spaced in the X direction) and is formed at a position adjacent to the $n^-$ type semiconductor region EX1. The $n^+$ type semiconductor region SD2 is spaced from the channel formation region by the $n^-$ type semiconductor region EX2 (spaced in the X direction) and is formed at a position adjacent to the $n^-$ type semiconductor region EX2. The $n^-$ type semiconductor region EX1 is interposed between the channel formation region and the $n^+$ type semiconductor region SD1, and the $n^-$ type semiconductor region EX2 is interposed between the channel formation region and the $n^+$ type semiconductor region SD2.

Each of the n-type semiconductor regions SR, DR is formed in the semiconductor substrate SB of MISFET formation region 1A (p-type well PW), and extends in the Y direction along the gate electrode GE. Therefore, each of the $n^-$ type semiconductor region EX1 and the $n^+$ type semiconductor region SD1 forming the n-type semiconductor region SR extends in the Y direction along the gate element GE, and each of the $n^-$ type semiconductor region EX2 and the $n^+$ type semiconductor region SD2 forming the n-type semiconductor region DR extends in the Y direction along the gate element GE.

A p-type halo regions (p-type semiconductor region, p-type pocket region) HA1, HA2 are formed in the semiconductor substrate SB (p-type well PW) of MISFET formation region 1A. In a cross-sectional view (a cross-sectional view that is roughly perpendicular to the Y direction), a p-type halo region HA1 is formed so as to cover (wrap) the $n^-$ type semiconductor region EX1, and in the cross-sectional view (a cross-sectional view that is roughly perpendicular to the Y direction), a p-type halo region HA2 is formed so as to cover (wrap) the $n^-$ type semiconductor region EX2. Therefore, the p-type halo region HA1 is adjacent to the side surface (side surface facing the $n^-$ type semiconductor region EX2) and the bottom surface of the $n^-$ type semiconductor region EX1, and the p-type halo region HA2 is adjacent to the side surface (side surface facing the n⁻ type semiconductor region EX1) and the bottom surface of the n⁻ type semiconductor region EX2. Part of each of the p-type halo regions HA1, HA2 overlaps with the gate electrode GE in plan view. Each of the p-type halo regions HA1, HA2 has a conductivity type opposite to that of the n⁻ type semiconductor regions EX1, EX2, and has the same conductivity type as that of the p-type well PW, and has an impurity concentration (p-type impurity concentration) higher than that of the p-type well PW. The p-type impurity concentration of the p-type halo regions HA1, HA2 can be, for example, about $2 \times 10^{17} \sim 1 \times 10^{19}$ cm³. The p-type impurity concentration of the p-type well PW can be, for example, about $1 \times 10^{17} \sim 5 \times 10^{18}$ cm³.

Although the p-type halo regions HA1, HA2 are formed in the vicinity of both end portions TB1, TB2 of MISFET formation region 1A in the Y direction (and therefore, in the region close to the element isolation region ST in the Y direction), the p-type halo regions HA1, HA2 are not formed in the center portion of MISFET formation region 1A in the Y direction (and therefore, in the region far from the element isolation region ST in the Y direction). The p-type halo regions HA1, HA2 are formed in contact with the element isolation region ST.

The p-type halo region HA1 and the p-type halo region HA2 formed in the vicinity of one end portion TB1 of both end portions TB1, TB2 of MISFET formation region 1A in the Y direction are referred to as a p-type halo region HA1*a* and a p-type halo region HA2*a*, respectively. The p-type halo region HA1 and the p-type halo region HA2 formed in the vicinity of the other end portion TB2 are referred to as a p-type halo region HA1*b* and a p-type halo region HA2*b*, respectively. The end portion TB1 and the end portion TB2 of MISFET formation region 1A are located on opposite sides in the Y direction. The p-type halo region HA1*a* and the p-type halo region HA2*a* are spaced in the X direction, the p-type halo region HA1*b* and the p-type halo region HA2*b* are spaced in the X direction, the p-type halo region HA1*a* and the p-type halo region HA1*b* are spaced in the Y direction, and the p-type halo region HA2*a* and the p-type halo region HA2*b* are spaced in the Y direction. The p-type halo region HA1 is not formed between the p-type halo region HA1*a* and the p-type halo region HA1*b*, and the p-type halo region HA2 is not formed between the p-type halo region HA2*a* and the p-type halo region HA2*b*. At the end portion TB1 of MISFET formation region 1A, the p-type halo region HA1*a* and the p-type halo region HA2*a* are in contact with the element isolation region ST. Also, at the end portion TB2 of MISFET formation region 1A, the p-type halo region HA1*b* and the p-type halo region HA2*b* are in contact with the element isolation region ST. On the other hand, each of the n⁻ type semiconductor region EX1, the n⁻ type semiconductor region EX2, the n⁺ type semiconductor region SD1 and the n⁺ type semiconductor region SD2 is continuously formed in Y direction from end portion TB1 to end portion TB2 of MISFET formation region 1A in Y direction.

As will be described later, the ion implantation for forming the p-type halo regions HA1, HA2 uses oblique ion implantation (incline ion implantation), whereby the p-type halo regions HA1, HA2 can be formed so as to cover (wrap) the n⁻ type semiconductor regions EX1, EX2. In general ion implantation (vertical ion implantation), impurity ions are accelerated and implanted in a direction perpendicular to the main surface of the semiconductor substrate SB, whereas in oblique ion implantation, impurity ions are accelerated and implanted in a direction inclined by a predetermined angle from a direction perpendicular to the main surface of the semiconductor substrate SB.

In the X direction, the n⁻ type semiconductor region EX1 and the p-type halo region HA1 are adjacent, and the n⁻ type semiconductor region EX2 and the p-type halo region HA2 are adjacent. A portion of the p-type halo region HA1 adjacent to the n⁻ type semiconductor region EX1 in the X direction is located under the gate electrode GE, and a portion of the p-type halo region HA2 adjacent to the n⁻ type semiconductor region EX2 in the X direction is located under the gate electrode GE. In another way, a portion of the p-type halo region HA1 adjacent to the n⁻ type semiconductor region EX1 in X direction overlaps with the gate electrode GE in a plan view, and a portion of the p-type halo region HA2 adjacent to the n⁻ type semiconductor region EX2 in the X direction overlaps with the gate electrode GE in a plan view. That is, a portion of each of the p-type halo regions HA1*a*, HA1*b* (a portion adjacent to the n⁻ semiconductor region EX1 in the X direction) is located under the gate electrode GE, and therefore overlaps with the gate electrode GE in plan view. Also, a portion of each of the p-type halo regions HA2*a*, HA2*b* (a portion adjoining n⁻ semiconductor region EX2 in the X-direction) is located under the gate electrode GE, and therefore overlaps with the gate electrode GE in plan view. The p-type halo regions HA1, HA2 located under the gate electrode GE, i.e., the p-type halo regions HA1, HA2 overlapping with the gate electrode GE in plan view, can function as a part of the channel formation region.

It is more preferable that a metal silicide layer (metal compound layer) SL is formed on each of the surfaces (upper surfaces) of the n⁺ type semiconductor regions SD1, SD2 by using a Salicide (Self Aligned Silicide) technique.

The metal silicide layer SL may be a cobalt silicide layer, a nickel silicide layer, a platinum-doped nickel silicide layer, or the like. Further, in the cases of FIGS. 3 and 4, also on the surface of the silicon film forming the gate electrode GE (upper surface), the metal silicide layer SL is formed. The metal silicide layer SL formed on the gate electrode GE can also be regarded as a part of the gate electrode GE. Further, it is preferable to form the metal silicide layer SL, but if not necessary, formation thereof can be omitted.

On the semiconductor substrate SB, an insulating film IL1 is formed as an interlayer insulating film so as to cover the gate electrode GE and the sidewall spacer SW. Upper surface of the insulating film IL1 is flattened. Contact holes (through holes) are formed in the insulating film IL1, and in the contact holes, the conductive plugs PG are embedded as a connecting conductor portion. The contact holes and the plugs PG embedded in the contact holes are formed on the n⁺ semiconductor regions SD1, SD2, the gate electrode GE, and the like. At the bottom of the contact holes in the insulating film IL1, for example, a part of the metal silicide layers SL on the surfaces of the n⁺ type semiconductor regions SD1, SD2, a part of the metal silicide layer SL on the surface of the gate electrode GE, and the like are exposed, and the plugs PG are connected to the exposed parts thereof.

Wirings M1 are formed on the insulating film IL1 in which the plugs PG are embedded. The wiring M1 is, for example, damascene wiring, and is embedded in a wiring trench provided in the insulating film IL2 formed on the insulating film IL1. The wirings M1 are electrically connected such as the n⁺ type semiconductor region SD1, the n⁺ type semiconductor region SD2 or a gate electrode GE via plugs PG. Further wirings and insulating films of upper layer are also formed, but the illustration and description thereof will be omitted here. Wirings M1 and wirings in upper layers are not limited to damascene wiring, but can also be formed by patterning a conductive film for wirings, for example, tungsten wiring or aluminum wiring.

<Manufacturing Process of Semiconductor Device>

Method of manufacturing a semiconductor device of the present embodiment will be explained by referring to the drawings.

FIGS. 5 to 22 are main portion cross-sectional views or main portion plan views during manufacturing process of the semiconductor device of the present embodiment. Of these, FIG. 5, FIG. 7, FIG. 9, FIG. 12, FIG. 14, FIG. 17, FIG. 19 and FIG. 21 show cross section substantially corresponding to FIG. 3 (cross section at the position of A1-A1 line of FIG. 1), also, FIG. 6, FIG. 8, FIG. 10, FIG. 13, FIG. 15, FIG. 18, FIG. 20 and FIG. 22 show cross section substantially corresponding to FIG. 4 (cross section at the position of B1-B1 line or C1-C1 line of FIG. 1). FIG. 11 and FIG. 16 are main portion plan views.

Figure 5:
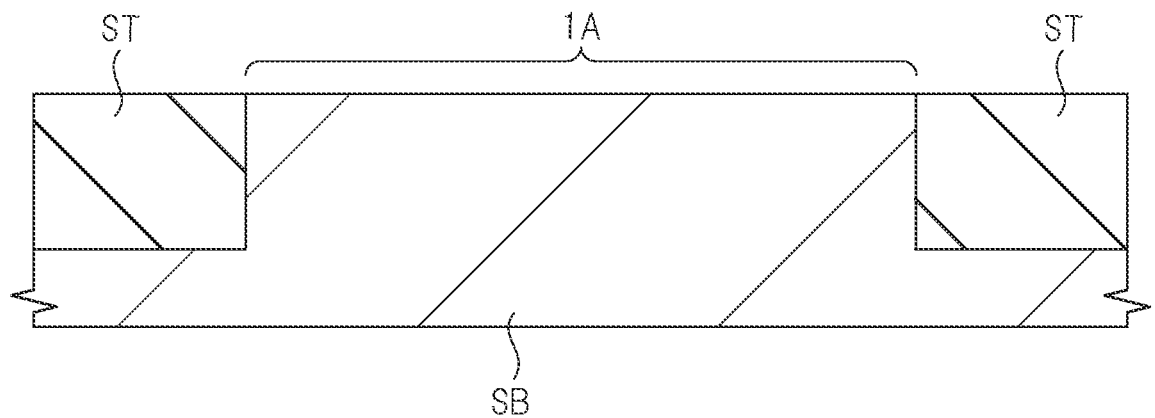
FIG. 5 is a main portion cross-sectional view during a manufacturing process of the semiconductor device of one embodiment.
Figure 6:
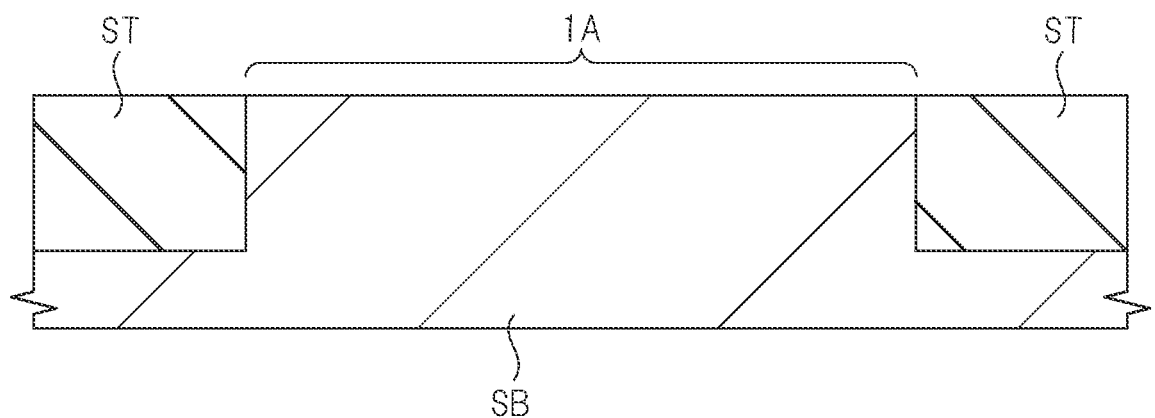
FIG. 6 is a main portion cross-sectional view during the same manufacturing process of the semiconductor device as in FIG. 5.

To manufacture a semiconductor device, as shown in FIGS. 5 and 6, first a semiconductor substrate (semiconductor wafer) SB made of, for example, p-type monocrystalline silicon having a resistivity of about 1 to 10 Ωcm, is prepared (provided). Then, on the main surface of the semiconductor substrate SB, an element isolation region ST is formed.

The element isolation region ST is made of an insulator such as silicon oxide and can be formed by an STI method. Specifically, after forming a trench for element isolation on the main surface of semiconductor substrate SB, in the trench for the element isolation, for example, by embedding an insulating film made of silicon oxide, it is possible to form the element isolation region ST. The element isolation region ST defines a MISFET formation region 1A which is an active region in which a MISFET 1 is formed.

Figure 7:
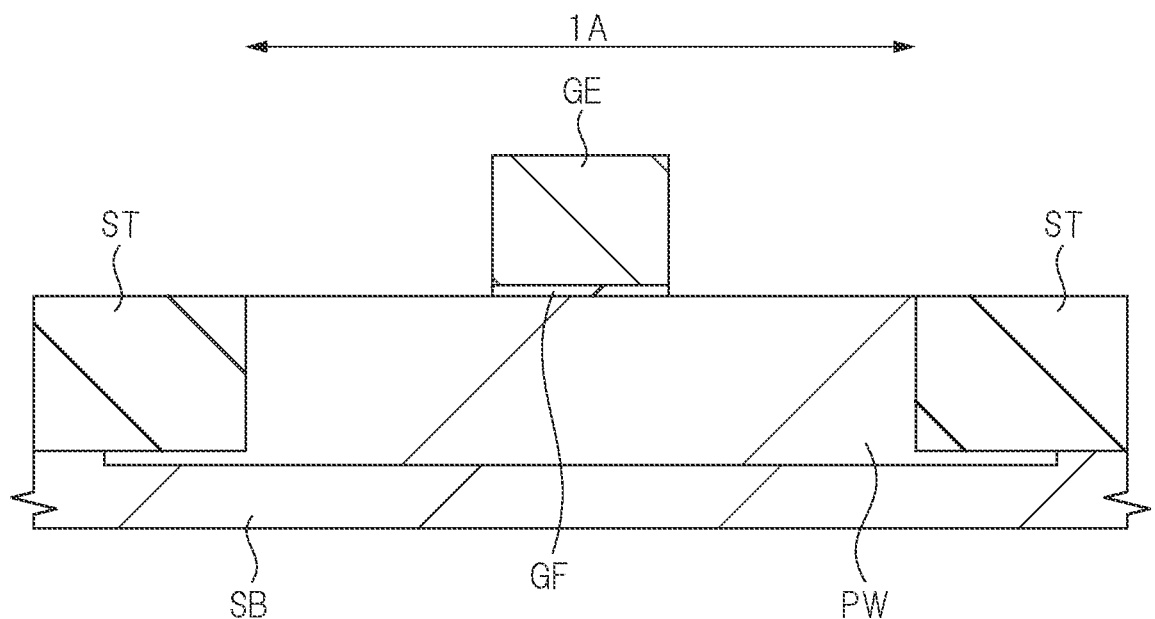
FIG. 7 is a main portion cross-sectional view during a manufacturing process of the semiconductor device following FIG. 5.
Figure 8:
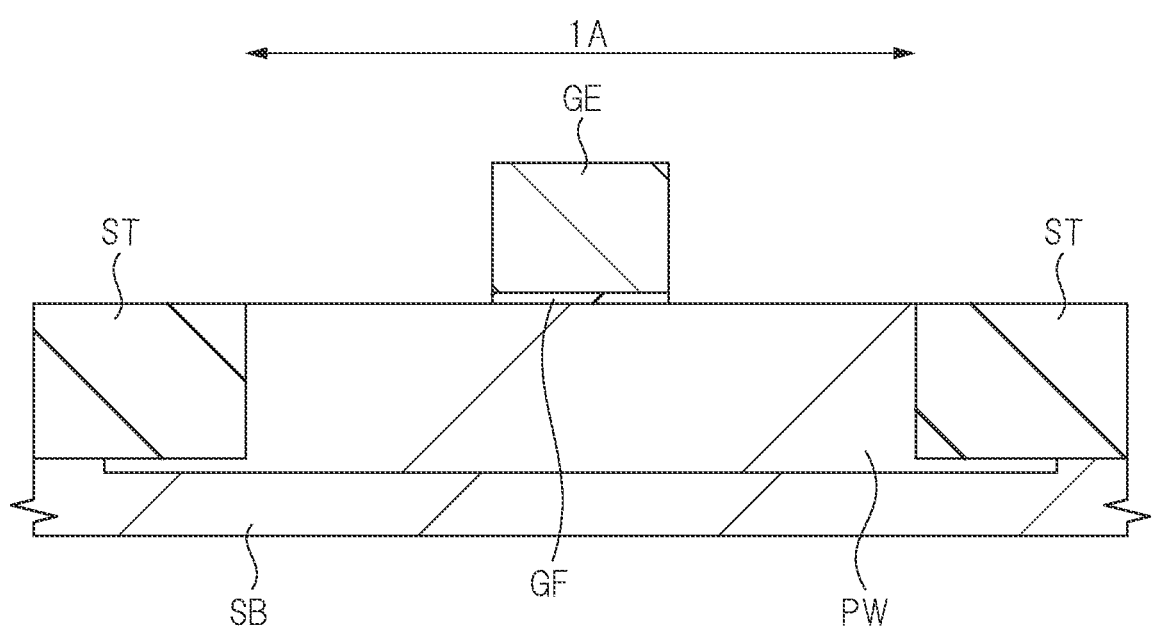
FIG. 8 is a main portion cross-sectional view during the same manufacturing process of the semiconductor device as in FIG. 7.

Next, as shown in FIGS. 7 and 8, p-type well PW is formed in the semiconductor substrate SB of MISFET formation region 1A.

The p-type well PW can be formed by ion-implanting p-type impurities such as boron (B) into the semiconductor substrate SB. The p-type well PW is formed over a predetermined depth from the main surface of the semiconductor substrate SB.

Next, as shown in FIGS. 7 and 8, a gate electrode GE is formed on the semiconductor substrate SB of MISFET formation region 1A (i.e., on the p-type well PW) via a gate dielectric film GF. This step can be carried out, for example, as follows.

That is, after the surface of the semiconductor substrate SB (p-type well PW) is cleaned by dilute hydrofluoric acid cleaning or the like, an insulating film for gate dielectric film GF is formed on the main surface of the semiconductor substrate SB (the surface of the p-type well PW). This insulating film is made of, for example, a silicon oxide film, and can be formed using a thermal oxidation method or the like. Next, a conductive film (e.g., polysilicon film) for forming the gate electrode GE is formed on the main surface of the semiconductor substrate SB (entire main surface), i.e., on the insulating film for gate dielectric film GF, and then a gate electrode GE is formed by patterning the conductor film using a photolithography method and a dry etching method. The insulating film left under the gate electrode GE (insulating film for gate dielectric film GF) is the gate dielectric film GF of MISFET 1. The gate electrode GE serving as a gate electrode of MISFET 1 is formed on the semiconductor substrate SB of MISFET formation region 1A (i.e., on the p-type well PW) via the gate dielectric film GF. Incidentally, since the gate electrode GE extends in the Y direction so as to cross MISFET formation region 1A in a plan view, a portion of the gate electrode GE is located on the element isolation region ST.

Figure 9:
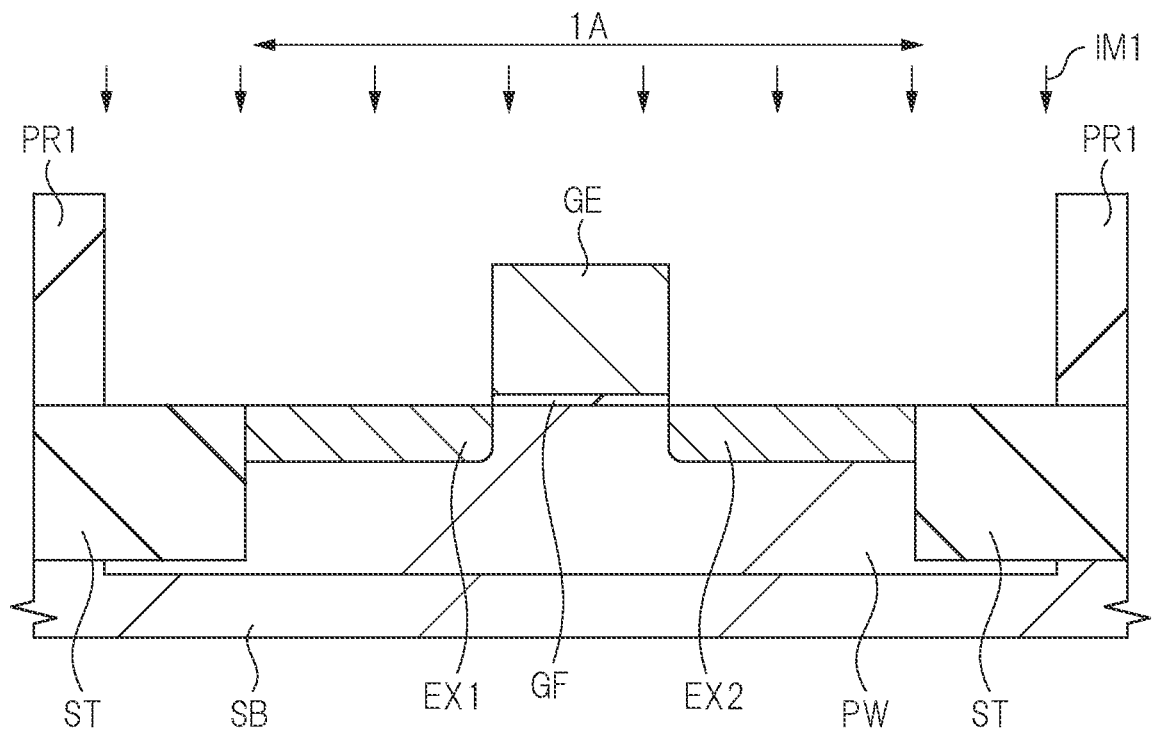
FIG. 9 is a main portion cross-sectional view during a manufacturing process of the semiconductor device following FIG. 7.
Figure 10:
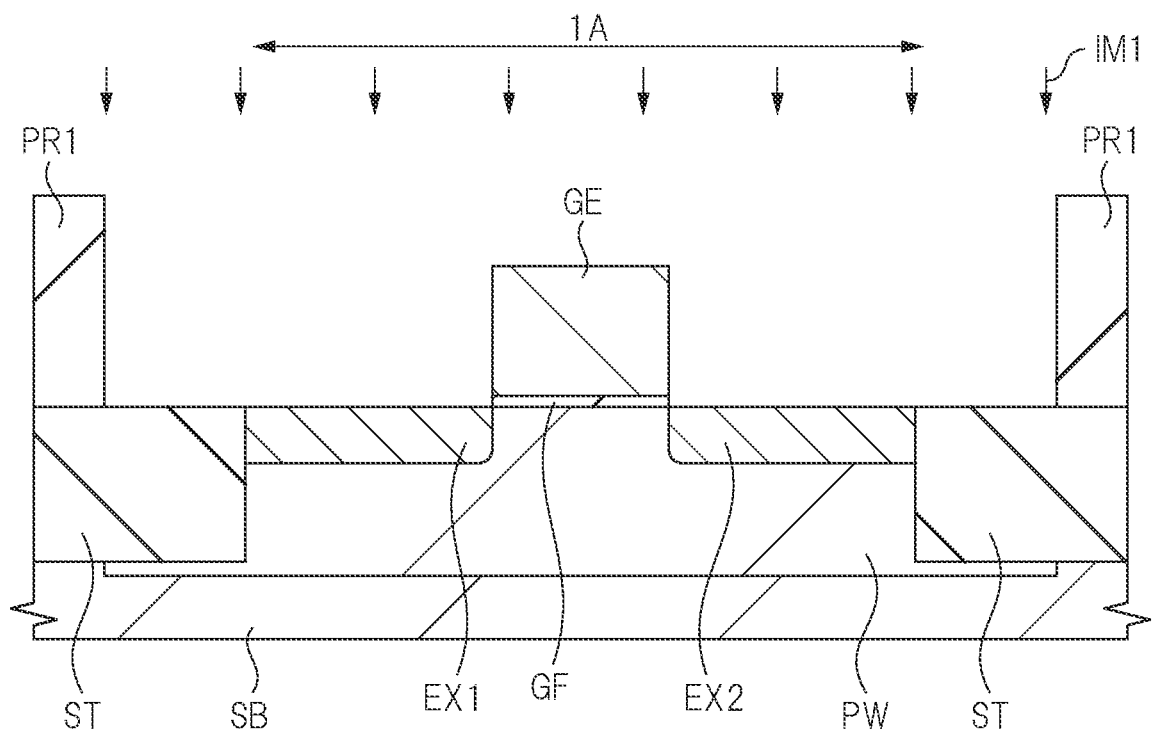
FIG. 10 is a main portion cross-sectional view during the same manufacturing process of the semiconductor device as in FIG. 9.
Figure 11:
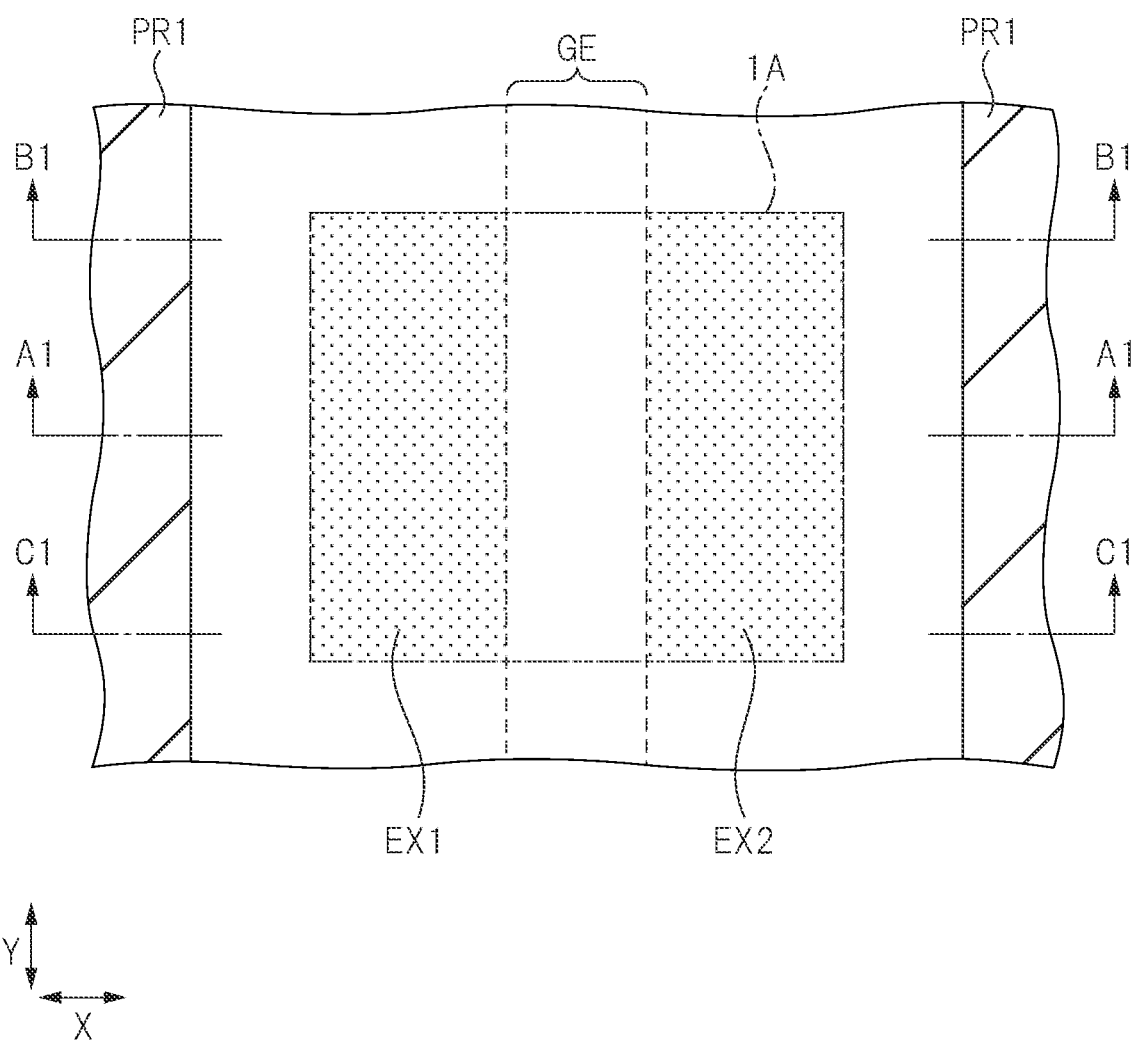
FIG. 11 is a main portion plan view during the same manufacturing process of the semiconductor device as in FIG. 9.

Next, as shown in FIGS. 9 and 10, n-type impurities such as phosphorus (P) or arsenic (As) are ion-implanted into regions on both sides of the gate electrode GE in the semiconductor substrate SB (p-type well PW) of MISFET formation region 1A to form an $n^-$ type semiconductor regions EX1, EX2. The ion implantation for forming the $n^-$ semiconductor regions EX1, EX2 is hereinafter referred to as an ion implantation IM1, and in FIGS. 9 and 10, the ion implantation IM1 is schematically shown by arrows.

In this ion implantation IM1, since the gate electrode GE can function as a mask (ion implantation blocking mask), the n-type semiconductor region EX1 is formed in alignment with one sidewall of the gate electrode GE, the $n^-$ type semiconductor region EX2 is formed in alignment with the other sidewall of the gate electrode GE, and no impurity is implanted into the region directly below the gate electrode GE in the semiconductor substrate SB (p-type well PW). The depth (junction depth) of each of the $n^-$ type semiconductor regions EX1, EX2 is shallower than the depth (junction depth) of each of $n^+$ type semiconductor regions SD1, SD2 formed later. The ion implantation IM1 for forming the $n^-$ semiconductor regions EX1, EX2 is preferably not oblique ion implantation but ion implantation perpendicular to the main surface of the semiconductor substrate SB (i.e., vertical ion implantation is preferable).

Further, it is also possible to perform the ion implantation IM1 in a state that a photoresist pattern (resist pattern) PR1 is formed, the photoresist pattern PR1 is formed using a photolithography technique on the semiconductor substrate SB after forming the gate electrode GE. In such case, by not covering MISFET formation region 1A with the photoresist pattern PR1, the formation of $n^-$ semiconductor regions EX1, EX2 in the semiconductor substrate SB (p-type well PW) of MISFET formation region 1A is not hindered by the photoresist pattern PR1. FIG. 11 is a plan view of the process of the ion implantation IM1. In FIG. 11, in order to make it easier to understand, the photoresist pattern PR1 is hatched, MISFET formation region 1A is indicated by a two-dot chain line, the gate electrode GE is indicated by a dotted line, and the region into which the impurity ions are implanted by the ion implantation IM1 is indicated by dots. Cross-sectional view at the position of A1-A1 line in FIG. 11 corresponds to FIG. 9, and cross-sectional view at the position of B1-B1 line or C1-C1 line in FIG. 11 corresponds to FIG. 10. When the ion implantation IM1 is performed while the photoresist pattern PR1 is formed, the photoresist pattern PR1 is removed by ashing or the like after the ion implantation IM1.

Figure 12:
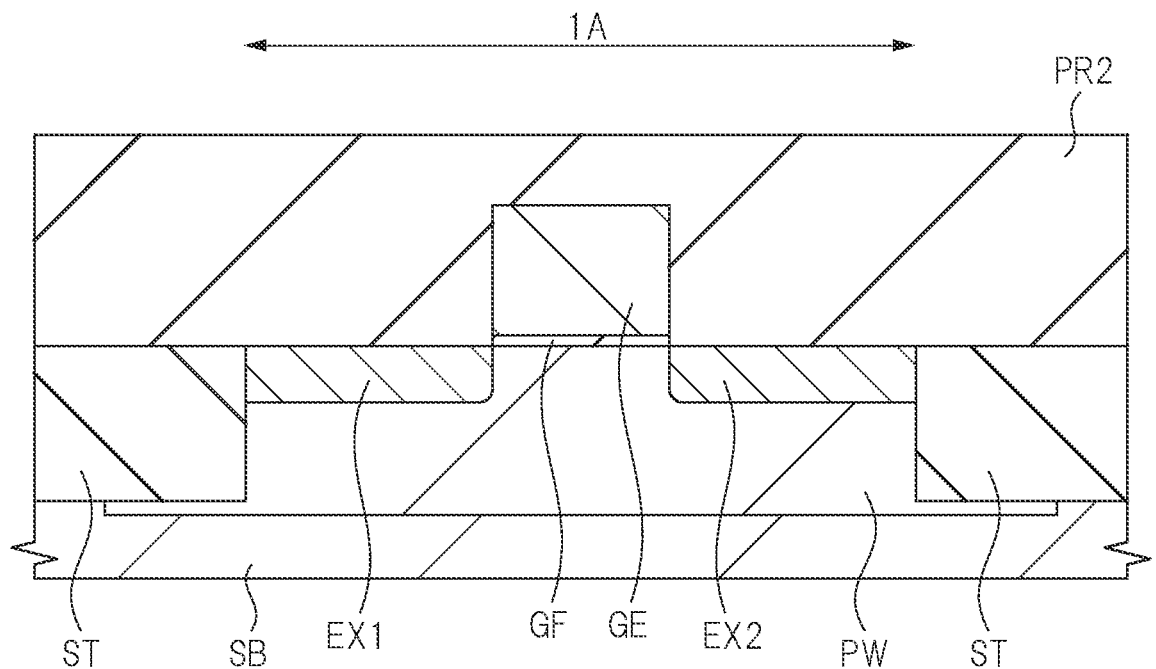
FIG. 12 is a main portion cross-sectional view during a manufacturing process of the semiconductor device following FIG. 9.
Figure 13:
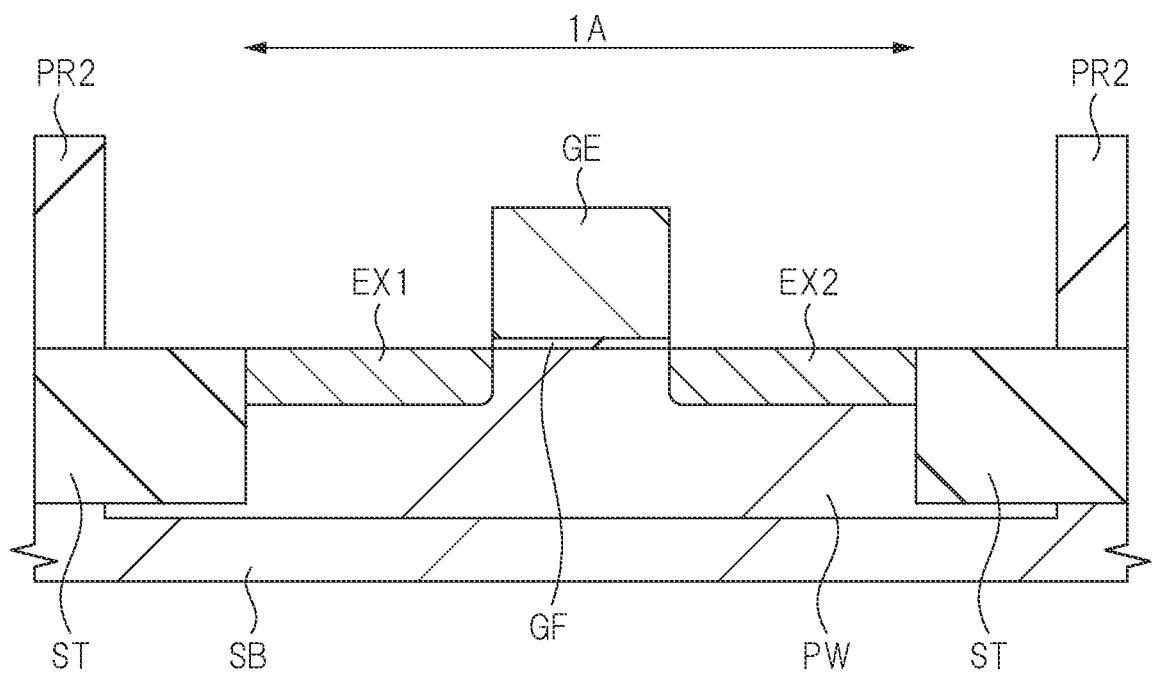
FIG. 13 is a main portion cross-sectional view during the same manufacturing process of the semiconductor device as in FIG. 12.

Next, as shown in FIGS. 12 and 13, a photoresist pattern (resist pattern) PR2 is formed on the semiconductor substrate SB using a photolithography technique. The photoresist pattern PR2 covers the center portion of MISFET formation region 1A in the Y direction, but does not cover the vicinity of both end portions of MISFET formation region 1A in the Y direction.

Figure 14:
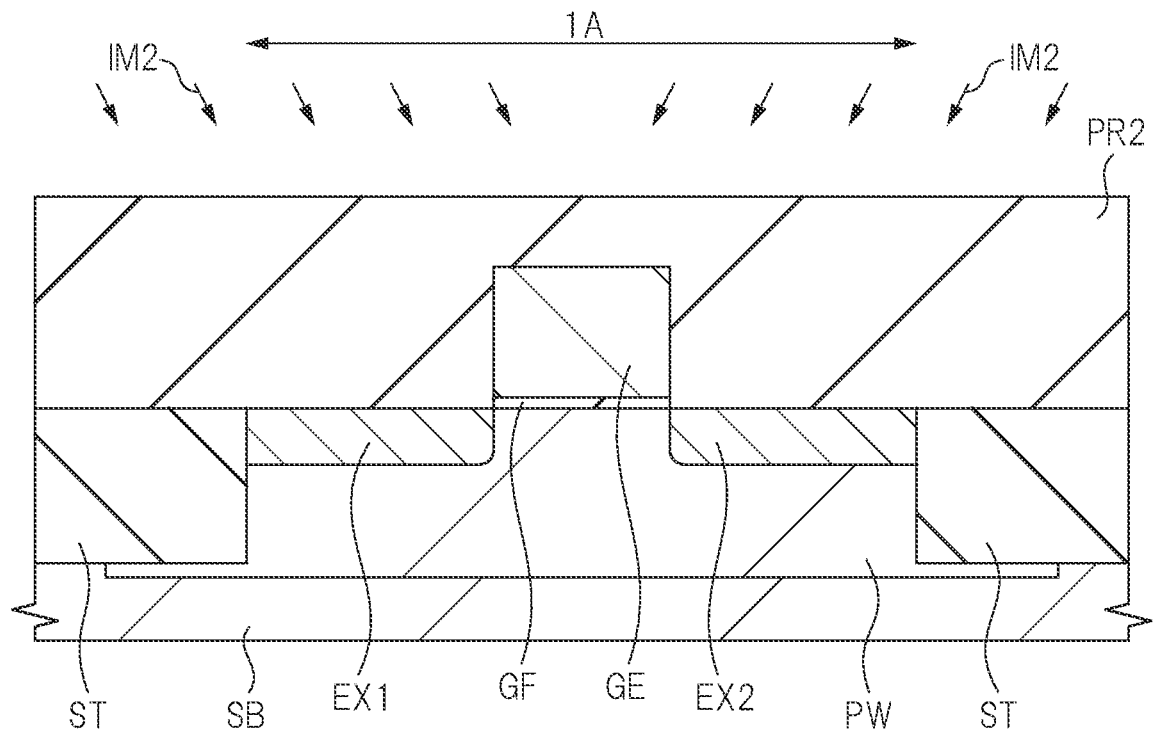
FIG. 14 is a main portion cross-sectional view during a manufacturing process of the semiconductor device following FIG. 12.
Figure 15:
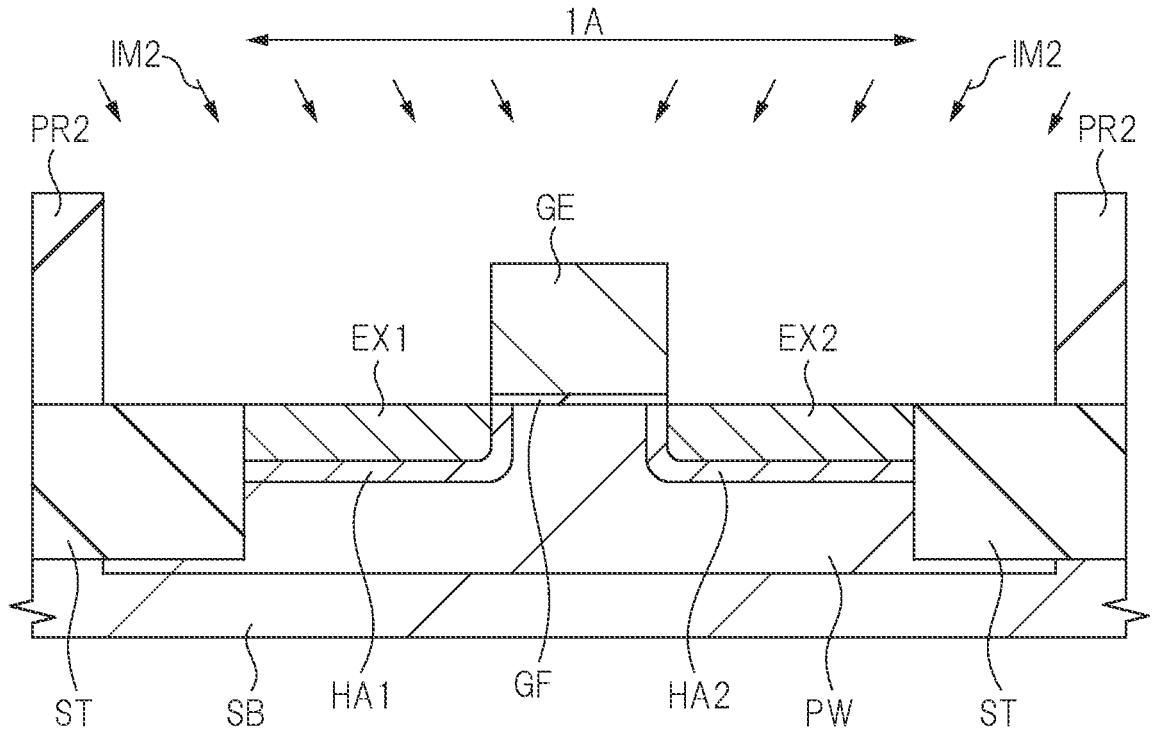
FIG. 15 is a main portion cross-sectional view during the same manufacturing process of the semiconductor device as in FIG. 14.
Figure 16:
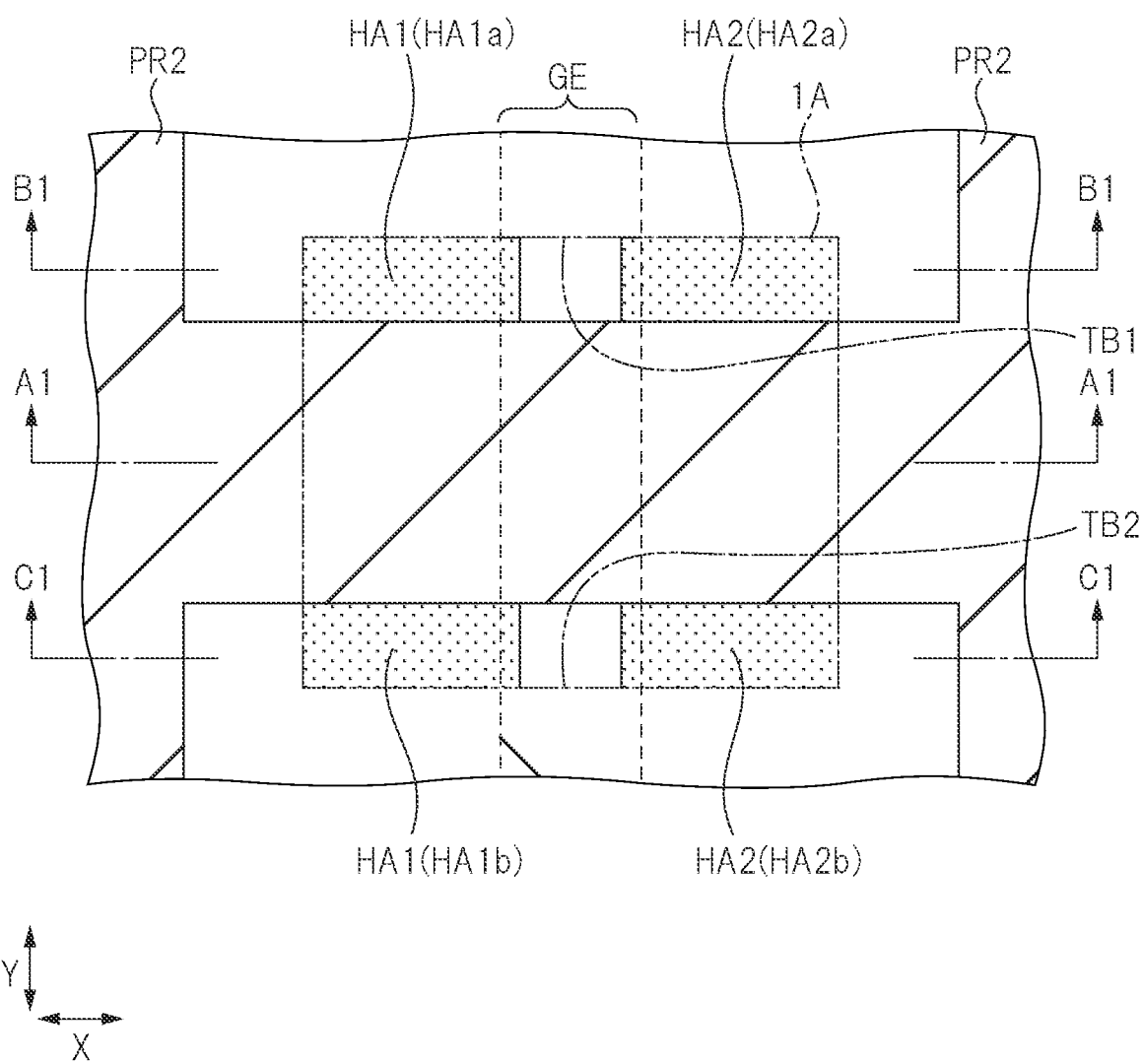
FIG. 16 is a main portion plan view during the same manufacturing process of the semiconductor device as in FIG. 14.

Next, as shown in FIGS. 14 and 15, p-type halo regions HA1, HA2 are formed by ion implantation (halo ion implantation) of p-type impurities such as boron (B) into the semiconductor substrate SB (p-type well PW) of MISFET formation region 1A. Ion implantation to form the p-type halo regions HA1, HA2 will hereinafter be referred to as ion implantation IM2, and in FIGS. 14 and 15, the ion implantation IM2 is schematically indicated by arrows. FIG. 16 is a plan view of the process of the ion implantation IM2. In FIG. 16, for simplicity of understanding, the photoresist pattern PR2 is hatched, MISFET formation region 1A is shown by a two-dot chain line, the gate electrode GE is shown by a dotted line, and the region where impurity ions are implanted by the ion implantation IM2 is shown with dots. Cross sectional view at the position of A1-A1 line in FIG. 16 corresponds to FIG. 14, and cross-sectional view at the position of B1-B1 line or C1-C1 line in FIG. 16 corresponds to FIG. 15. After the ion implantation IM2, the photoresist pattern PR2 is removed by ashing or the like.

In the ion implantation IM2 for forming the p-type halo regions HA1, HA2, the gate electrode GE can also function as a mask (ion implantation blocking mask). However, oblique ion implantation is applied in the ion implantation IM2 for forming the p-type halo regions HA1, HA2. Thus, the p-type halo region HA1 is formed so as to cover (wrap) the $n^-$ type semiconductor region EX1, the p-type halo region HA2 is formed so as to cover (wrap) the $n^-$ type semiconductor region EX2, each part of the p-type halo regions HA1, HA2 is positioned directly below the gate electrode GE (i.e., overlaps the gate electrode GE in a plan view). The p-type halo region HA1 and the p-type halo region HA2 are spaced from each other in the Y direction. Each of the p-type halo regions HA1, HA2 has the same conductivity type as the p-type well PW, but has p-type impurity concentration higher than that of the p-type well PW.

In the ion implantation IM2 for forming the p-type halo regions HA1, HA2, the photoresist pattern PR2 can also function as a mask (ion implantation blocking mask). Therefore, in the ion implantation IM2, p-type impurities are not implanted into portion of the semiconductor substrate SB (p-type well PW) of MISFET formation region 1A that is covered with the photo resist pattern PR2. Therefore, the p-type halo regions HA1, HA2 are not formed in the portion of the semiconductor substrate SB (p-type well PW) of MISFET formation region 1A, that is covered with the photoresist pattern PR2, and the p-type halo regions HA1, HA2 are formed in the portion that is not covered with the photoresist pattern PR2. Therefore, the p-type halo regions HA1, HA2 are formed in the vicinity of the both end portions TB1, TB2 of MISFET formation region 1A in the Y direction (and therefore, in the region close to the element isolation region ST in the Y direction), but the p-type halo regions HA1, HA2 are not formed in the center portion of MISFET formation region 1A in the Y direction (and therefore, in the region far from the element isolation region ST in the Y direction).

Further, although a case of forming p-type halo regions HA1, HA2 after first forming the $n^-$ type semiconductor regions EX1, EX2 has been described as a preferred embodiment, as another embodiment, it is also possible to form the $n^-$ type semiconductor regions EX1, EX2 after forming the p-type halo regions HA1, HA2 first. However, the ion implantation IM1 for forming the n-semiconductor regions EX1, EX2 and the ion implantation IM2 for forming the p-type halo regions HA1, HA2 need to be performed at least after forming the gate electrode GE and prior to forming the sidewall spacers SW on the sidewalls of the gate electrode GE.

Figure 17:
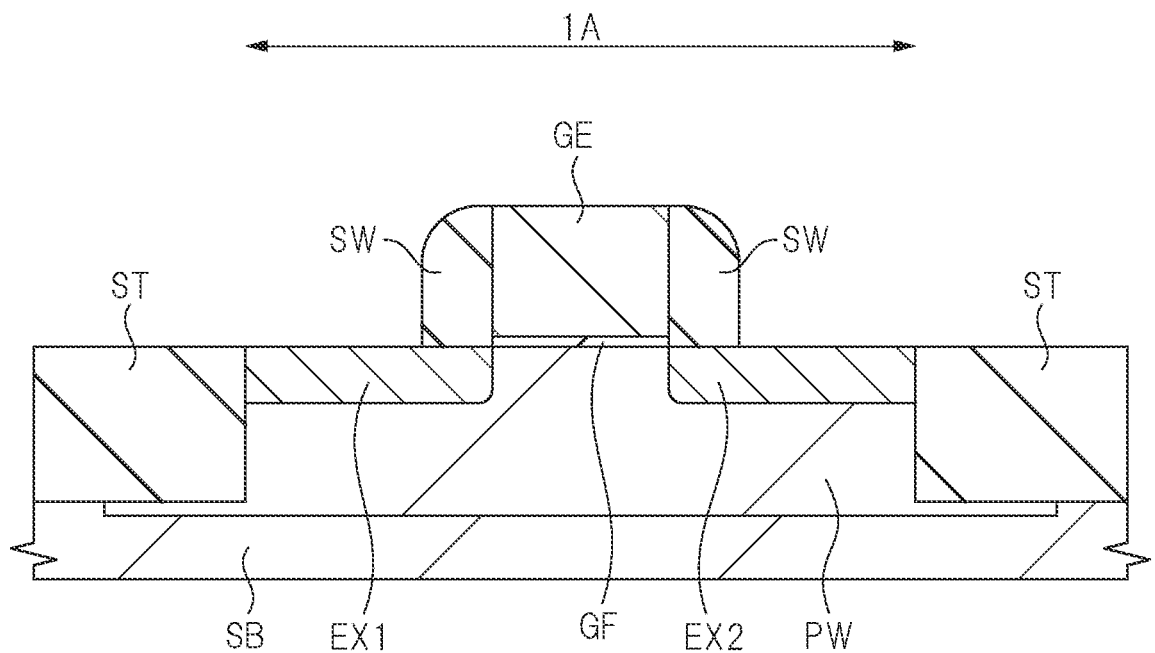
FIG. 17 is a main portion cross-sectional view during a manufacturing process of the semiconductor device following FIG. 14.
Figure 18:
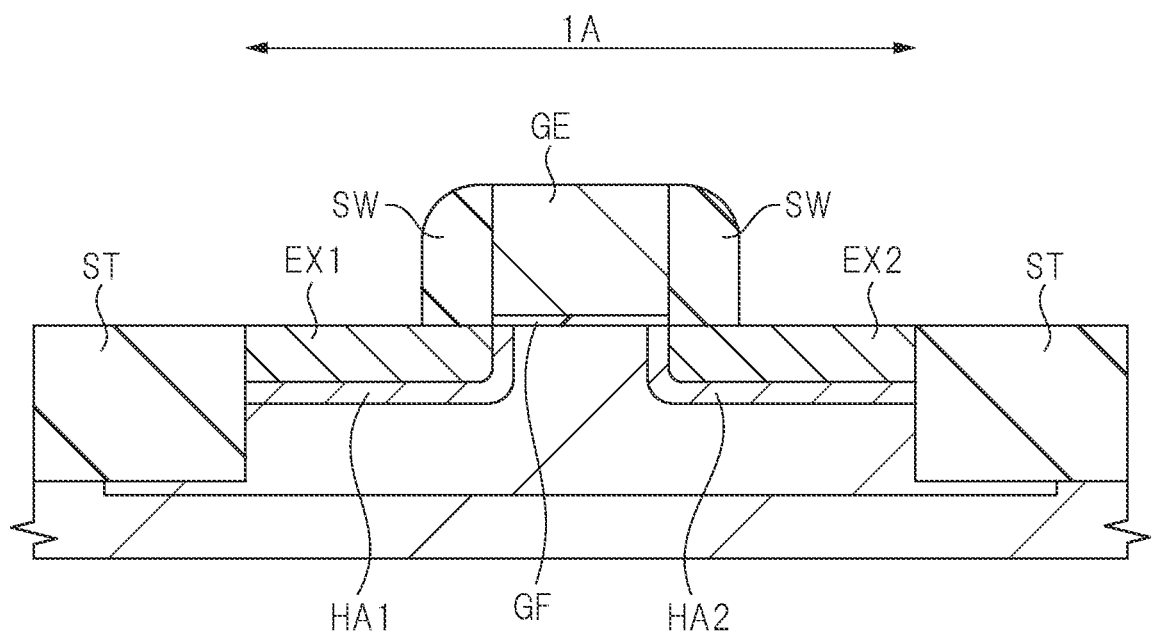
FIG. 18 is a main portion cross-sectional view during the same manufacturing process of the semiconductor device as in FIG. 17.

Next, as shown in FIGS. 17 and 18, a sidewall spacer SW made of, for example, silicon oxide or silicon nitride or a stacked film thereof is formed on each of the sidewalls of the gate electrode GE. The sidewall spacers SW can be formed, for example, by depositing a silicon oxide film or a silicon nitride film or a stacked film thereof on the entire main surface of the semiconductor substrate SB and then etching it back using an anisotropic etching technique.

Figure 19:
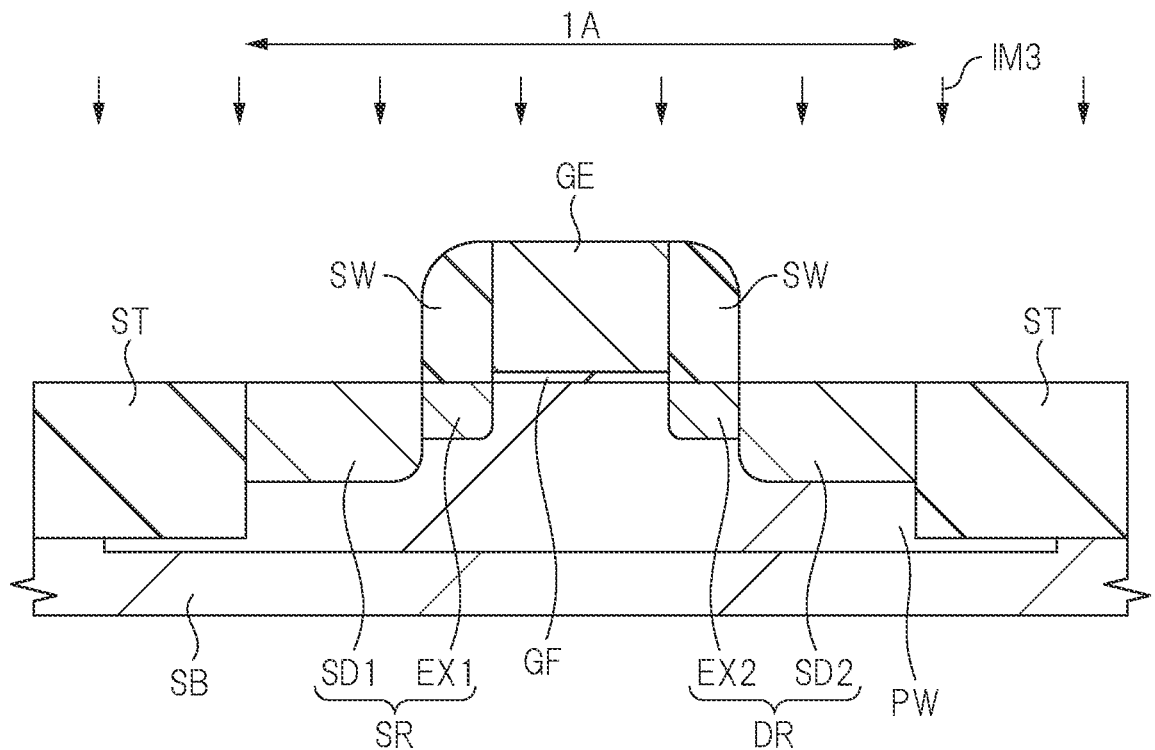
FIG. 19 is a main portion cross-sectional view during a manufacturing process of the semiconductor device following FIG. 17.
Figure 20:
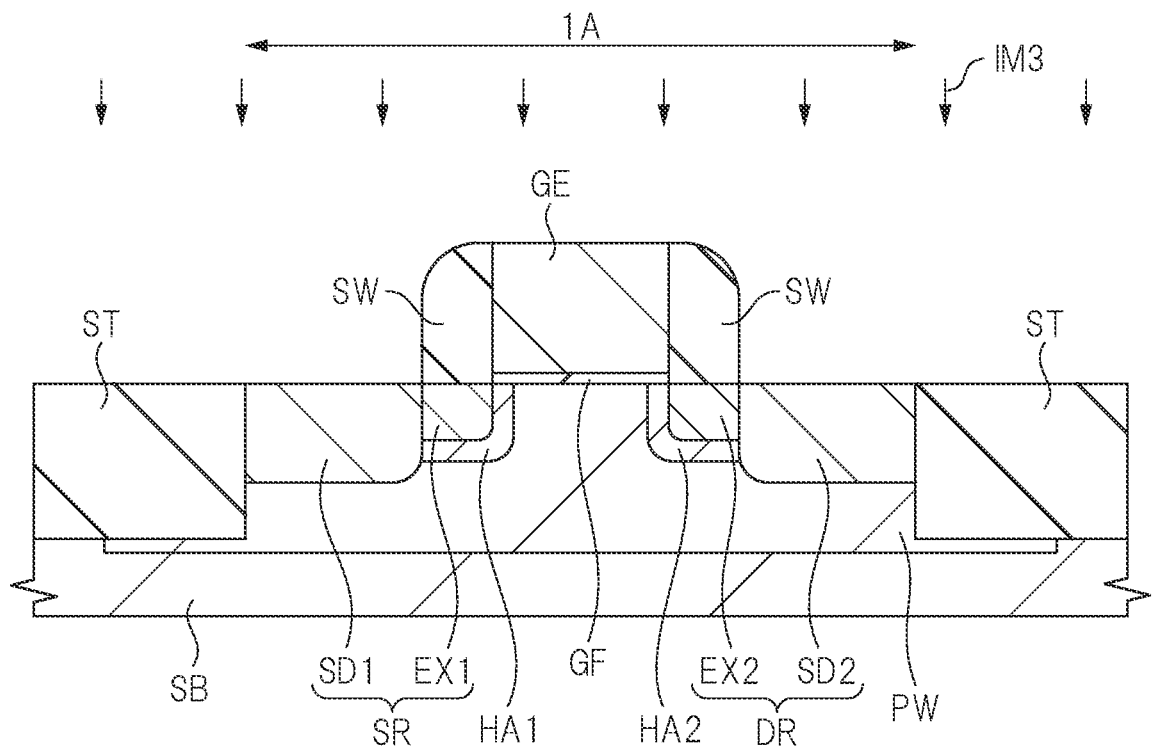
FIG. 20 is a main portion cross-sectional view during the same manufacturing process of the semiconductor device as in FIG. 19.

Next, as shown in FIGS. 19 and 20, in the semiconductor substrate SB (p-type well PW) of MISFET formation region 1A, n-type impurities such as phosphorus (P) or arsenic (As) are ion-implanted into regions on both sides of a structure formed of the gate electrode GE and the sidewall spacers SW on the sidewalls of the gate electrode GE to form $n^+$ type semiconductor regions SD1, SD2. The ion implantation for forming the $n^+$ semiconductor regions SD1, SD2 is hereinafter referred to as an ion implantation IM3, and in FIGS. 19 and 20, the ion implantation IM3 is schematically shown by arrows.

In this ion implantation IM3, the gate electrode GE and the sidewall spacers SW on the sidewalls of the gate electrode GE can function as masks (ion implantation blocking masks). Therefore, the $n^+$ type semiconductor region SD1 is formed in alignment with the sidewall spacer SW on one sidewall of the gate electrode GE, the $n^+$ type semiconductor region SD2 is formed in alignment with the sidewall spacer SW on the other sidewall of the gate electrode GE, and no impurity is implanted into the region of the semiconductor substrate SB (p-type well PW) directly below the gate electrode GE and the sidewall spacer SW. The ion implantation IM3 for forming the $n^+$ semiconductor regions SD1, SD2 is preferably not oblique ion implantation but ion implantation perpendicular to the main surface of the semiconductor substrate SB (i.e., vertical ion implantation is preferable).

The depth (junction depth) of each of the $n^+$ semiconductor regions SD1, SD2 is deeper than the depth (junction depth) of the $n^-$ semiconductor regions EX1, EX2. Further, the $n^+$ type semiconductor regions SD1, SD2 and the $n^-$ type semiconductor regions EX1, EX2 are of the same conductivity type, and the $n^+$ type semiconductor regions SD1, SD2 have the n-type impurity concentration higher than that of the $n^-$ type semiconductor regions EX1, EX2. Thus, the n-type semiconductor region SR which functions as one of the source or drain of MISFET 1 is formed by $n^+$ type semiconductor region SD1 and $n^-$ type semiconductor region EX1, and the n-type semiconductor region DR which functions as the other of the source or drain of MISFET 1 is formed by $n^+$ type semiconductor region SD2 and $n^-$ type semiconductor region EX2.

Next, if necessary, activation annealing is performed which is a heat treatment for activating impurities implanted by ion implantation so far.

In this manner, a MISFET 1 is formed.

Figure 21:
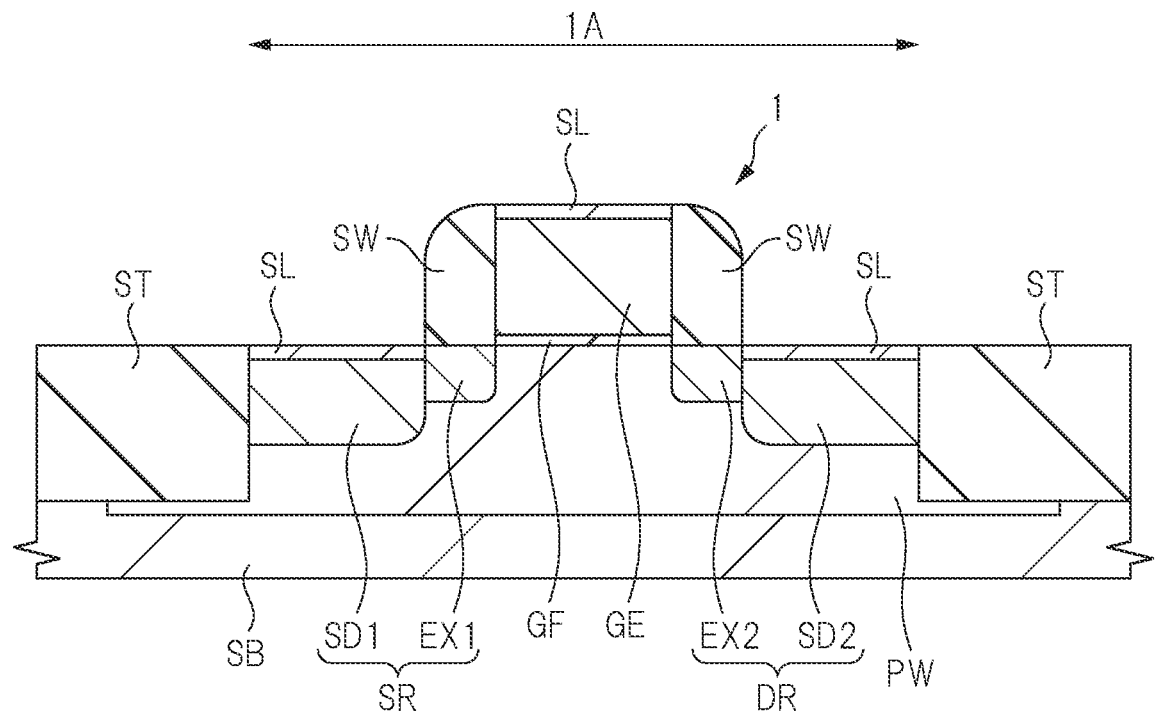
FIG. 21 is a main portion cross-sectional view during a manufacturing process of the semiconductor device following FIG. 19.
Figure 22:
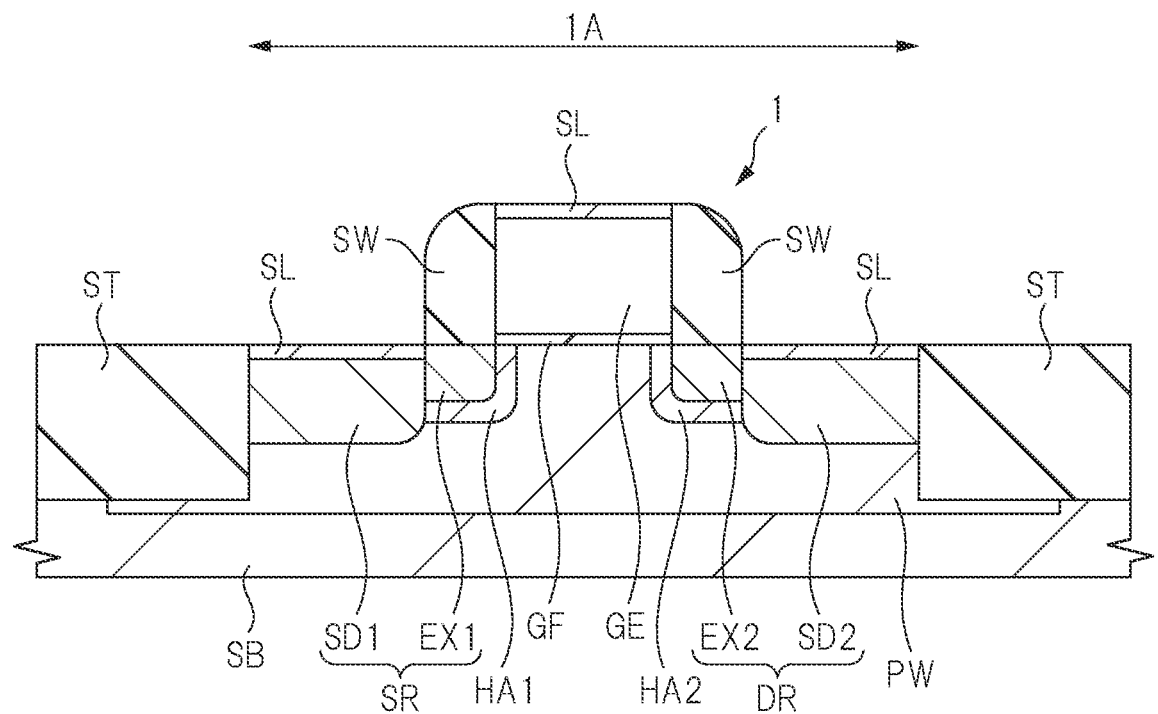
FIG. 22 is a main portion cross-sectional view during the same manufacturing process of the semiconductor device as in FIG. 21.

Next, as shown in FIGS. 21 and 22, a metal silicide layer SL is formed by a salicide technique. The metal silicide layer SL is formed on each of the surfaces of the $n^+$ semiconductor regions SD1, SD2 and on upper surface of the silicon film forming the gate electrode GE.

The forming process of the metal silicide layer SL can be performed, for example, as follows. First, a metal film is formed on the main surface of the semiconductor substrate SB so as to cover the gate electrode GE, the sidewall spacers SW, and the $n^+$ type semiconductor regions SD1, SD2. The metal film is made of, for example, a cobalt film, a nickel film, a nickel platinum alloy film, or the like. Then, the metal film is reacted with the $n^+$ semiconductor regions SD1, SD2 and the gate electrode GE by heat treatment. As a result, a metal silicide layer SL, which is a reaction layer (compound layer) of a metal and a semiconductor, is formed. Thereafter, the unreacted metal film is removed. This step is illustrated in FIGS. 21 and 22. When the metal film is a nickel film, the metal silicide layer SL is a nickel silicide layer, and when the metal film is a nickel platinum alloy film, the metal silicide layer SL is a nickel platinum silicide layer.

Next, as shown in FIGS. 3 and 4 above, on the main surface of the semiconductor substrate SB, an insulating film IL1 is formed as an interlayer insulating film so as to cover the gate electrode GE, the sidewall spacers SW and the metal silicide layers SL. As the insulating film IL1, a single-layer insulating film (e.g., a silicon oxide film) or a multilayer insulating film (e.g., a multilayer film of a silicon nitride film and a silicon oxide film thereon) can be used, and can be formed by, for example, a CVD method or the like. After forming the insulating film IL1, it is also possible to enhance the flatness of upper surface of the insulating film IL1 by, for example, polishing upper surface of the insulating film IL1 by CMP method.

Next, contact holes are formed in the insulating film IL1 using photolithography and etching techniques. Then, in the contact holes, as conductive portions for connection, conductive plugs PG made of tungsten (W) or the like are formed. To form the plugs PG, for example, a barrier conductor film is formed on the insulating film IL1 including the bottom surface and the sidewall of the contact holes, then a main conductor film made of such tungsten film is formed on the barrier conductor film so as to embed the contact holes. Thereafter, unnecessary main conductor film and barrier conductor film outside the contact holes are removed by a CMP method, an etch-back method, or the like, whereby the plugs PG can be formed.

Next, an insulating film IL2 for forming wirings is formed on the insulating film IL1 in which plugs PG are embedded. Then, wiring trenches are formed in the insulating film IL2 using photolithography and etching techniques, and wirings M1 are formed in the wiring trenches using damascene techniques. Thereafter, upper layer wirings and upper layer insulating films are formed, the illustration and description thereof will be omitted here.

As described above, semiconductor device of the present embodiment is manufactured.

<Background of Study>

Figure 23:
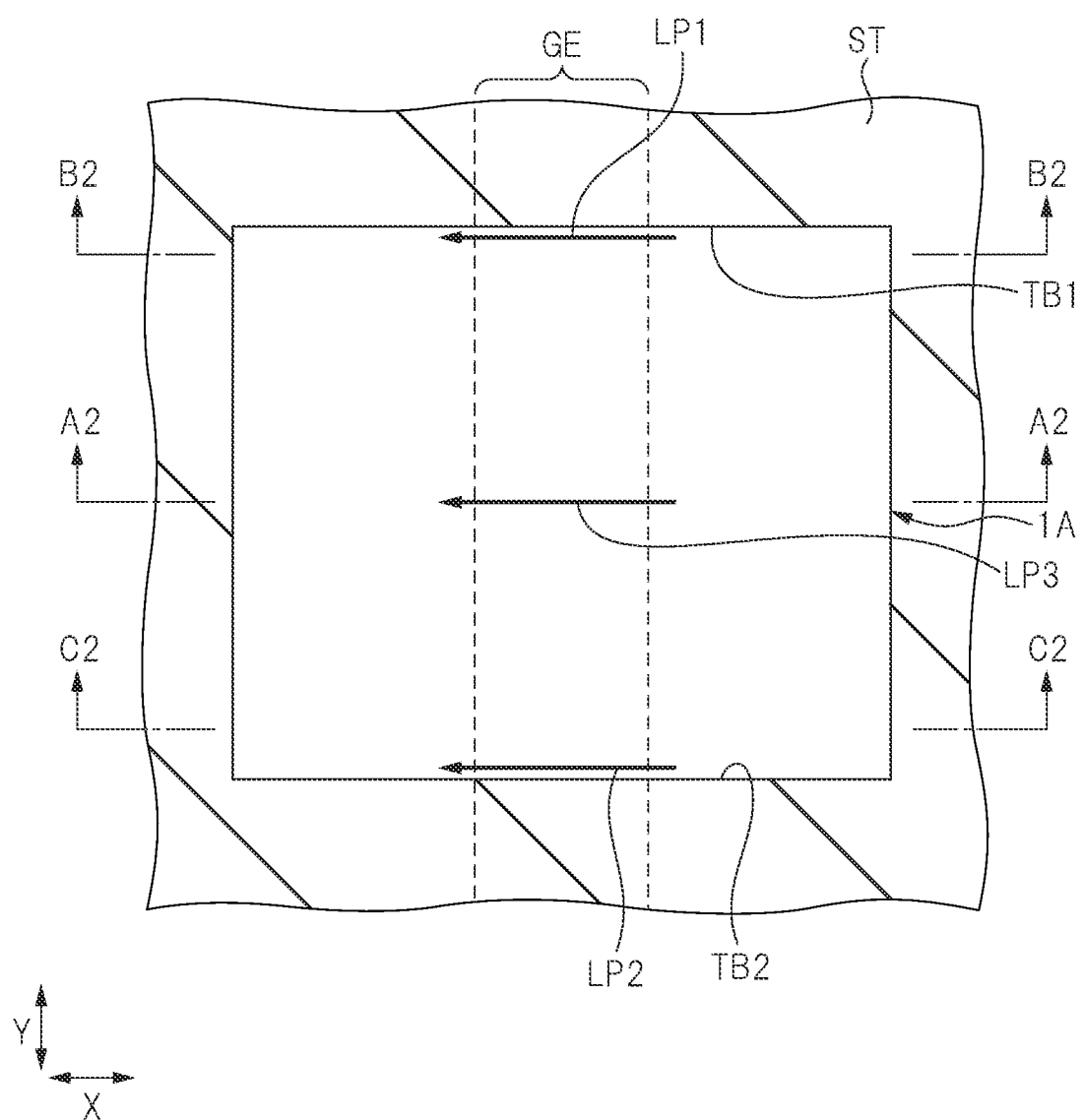
FIG. 23 is a main portion plan view of a semiconductor device of first examined example.
Figure 24:
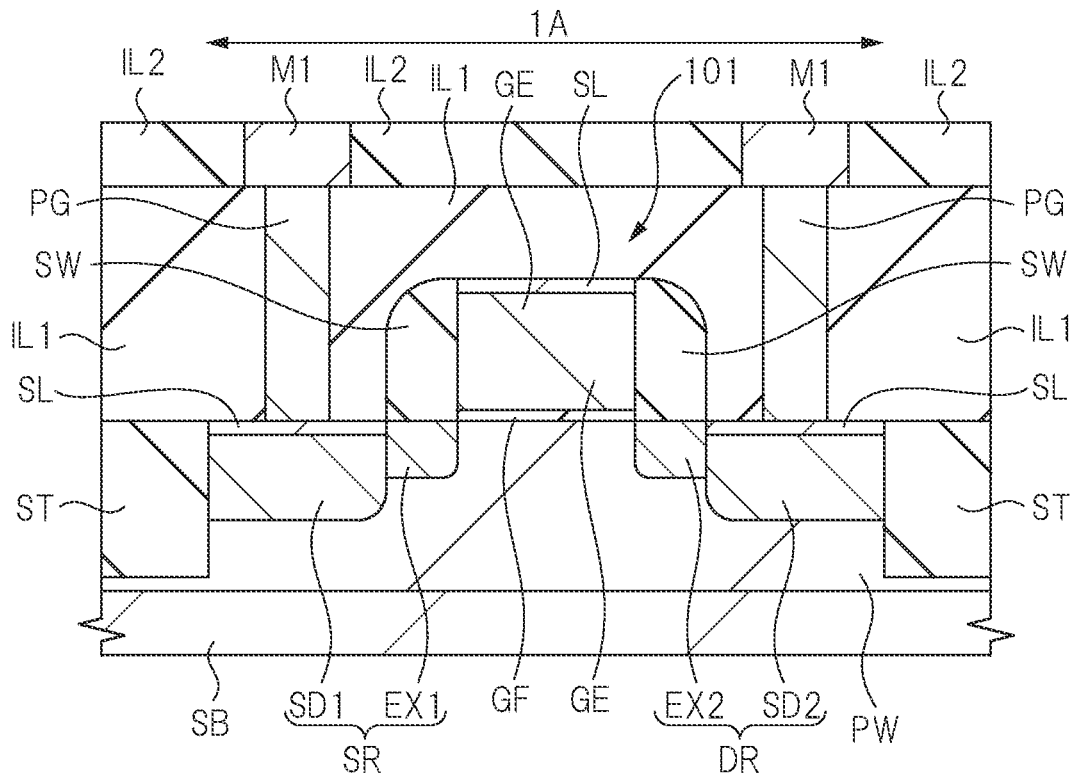
FIG. 24 is a main portion cross-sectional view of the semiconductor device of the first examined example.
Figure 25:
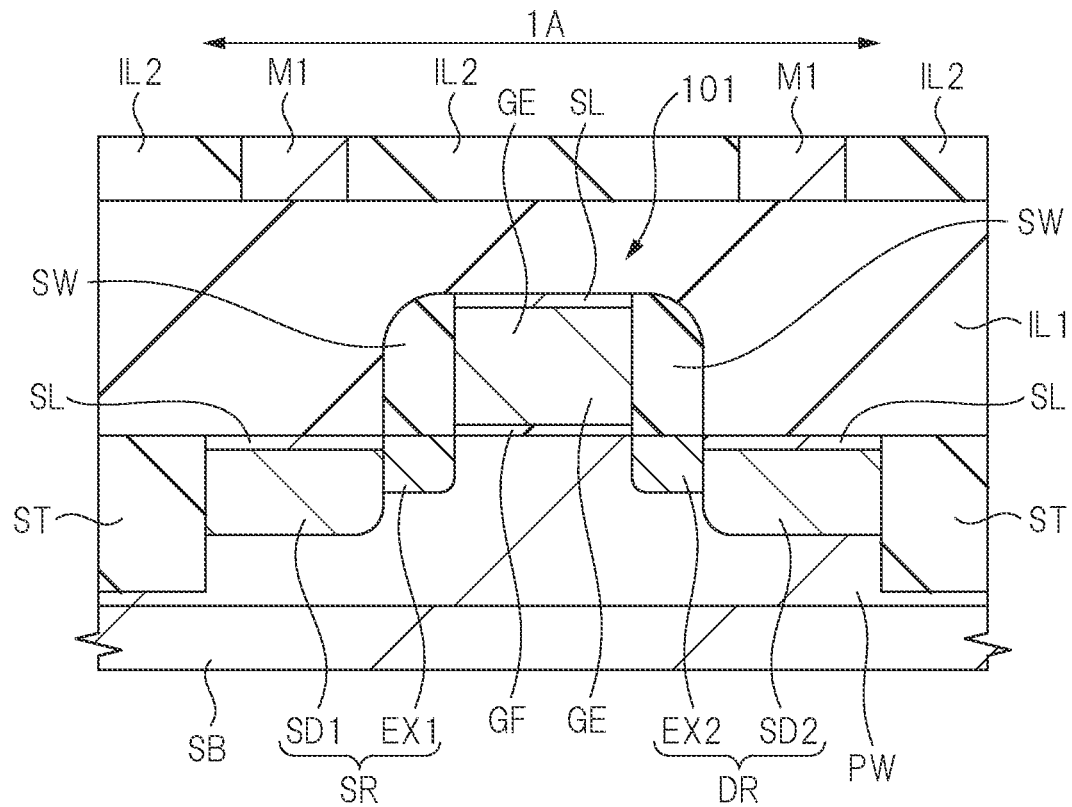
FIG. 25 is a main portion cross-sectional view of the semiconductor device of the first examined example.
Figure 26:
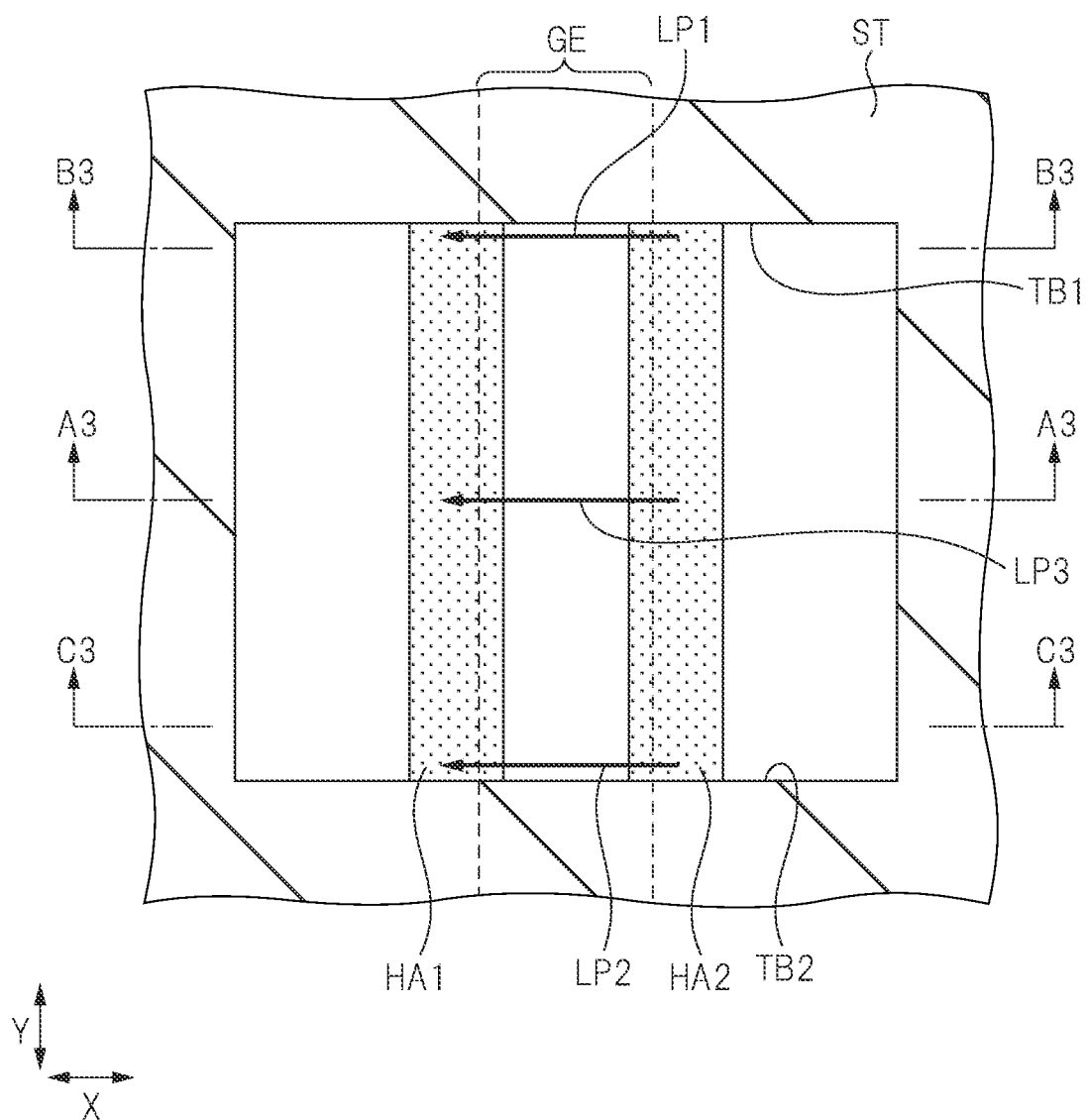
FIG. 26 is a main portion plan view of the semiconductor device of the first examined example.
Figure 27:
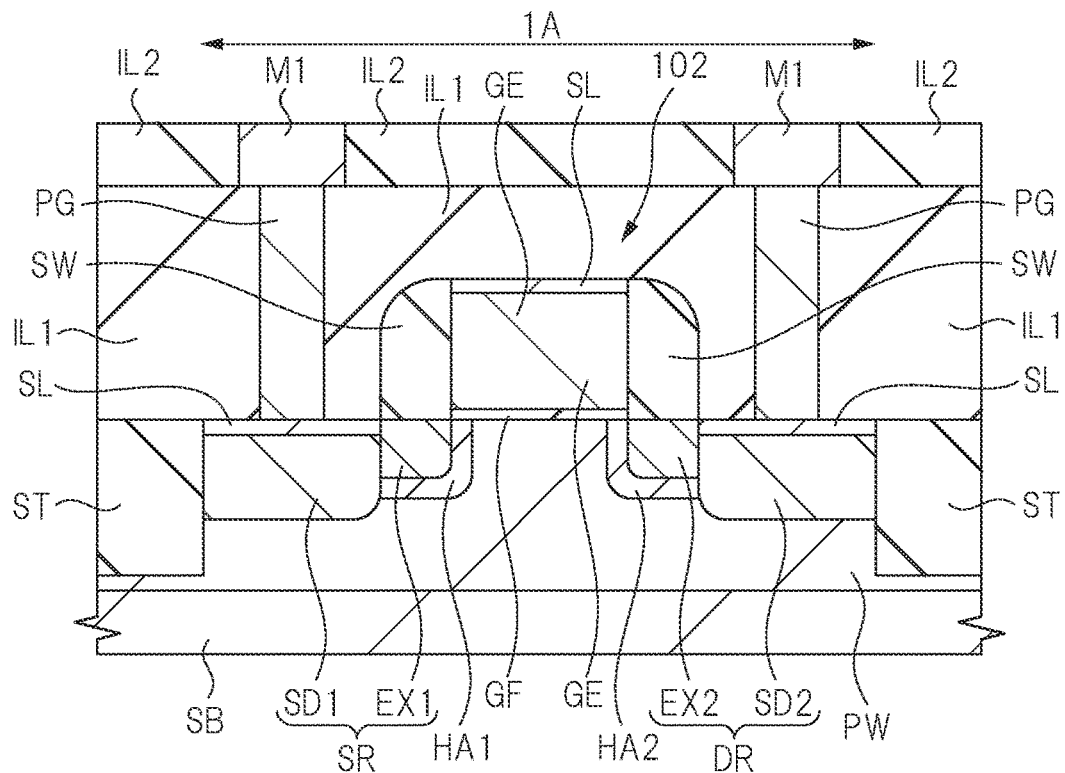
FIG. 27 is a main portion cross-sectional view of the semiconductor device of the first examined example.
Figure 28:
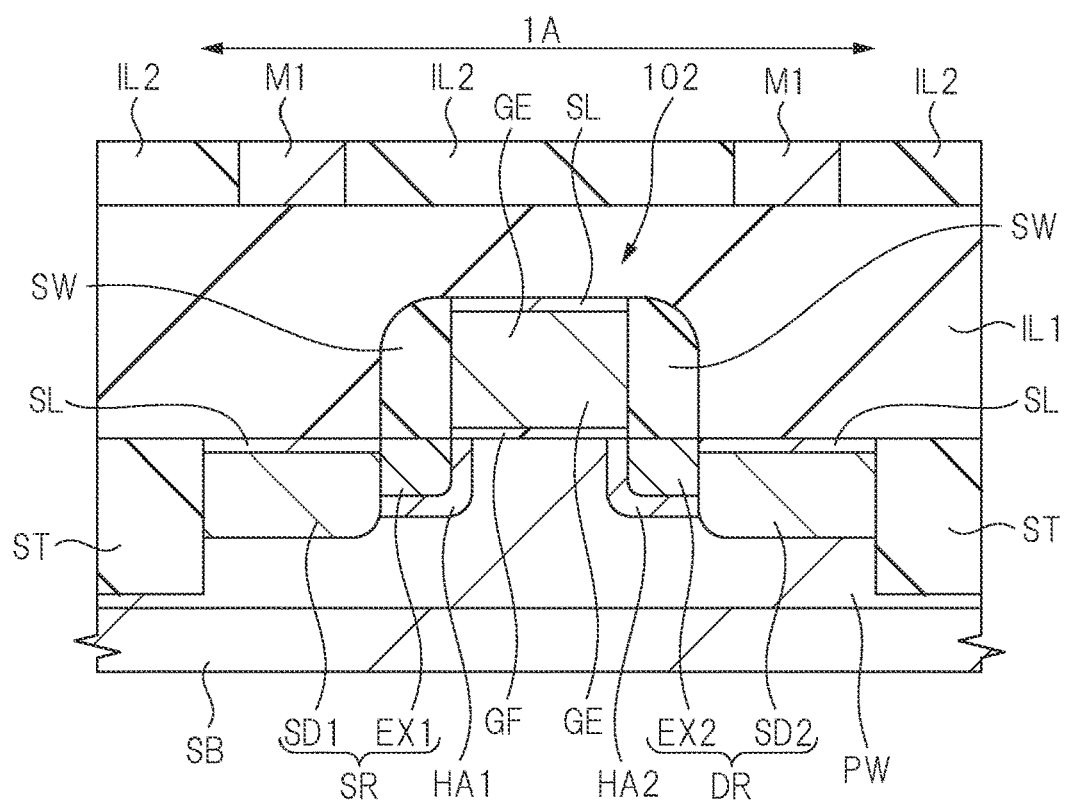
FIG. 28 is a main portion cross-sectional view of the semiconductor device of the first examined example.

FIG. 23 is a main portion plan view of semiconductor device of the first examined example considered by the present inventors, and FIGS. 24 and 25 are main portion cross sectional view of semiconductor device of the first examined example. Cross-sectional view at the position of A2-A2 line in FIG. 23 corresponds to FIG. 24, and cross-sectional view at the position of B2-B2 line or C2-C2 line in FIG. 23 corresponds to FIG. 25. For simplicity of understanding, in FIG. 23, a hatching is attached to the element isolation region ST, the formation position of the gate electrode GE is shown by a dotted line. Further, FIG. 26 is a main portion plan view of semiconductor device of the second examined example considered by the present inventors, and FIGS. 27 and 28 are main portion cross-sectional view of semiconductor device of the second examined example. Cross-sectional view at the position of A3-A3 line in FIG. 26 corresponds to FIG. 27, and cross-sectional view at the position of B3-B3 line or C3-C3 line in FIG. 26 corresponds to FIG. 28. For simplicity of understanding, in FIG. 26, a hatching is attached to the element isolation region ST, the formation position of the gate electrode GE is indicated by a dotted line, the region where the p-type halo regions HA1, HA2 are formed is shown with dots.

Semiconductor device of the first examined example shown in FIGS. 23 to 25 is different from semiconductor device of the present embodiment in FIGS. 1 to 4 in the following points. That is, in semiconductor device of the first examined example shown in FIGS. 23 to 25, the p-type halo regions HA1, HA2 are not formed at all in the semiconductor substrate SB (p-type well PW) of MISFET formation region 1A. A MISFET formed in MISFET formation region 1A in the first examined example is denoted by reference numeral 101 and is referred to as a MISFET 101.

When a MISFET 101 is formed on the active region (here, MISFET formation region 1A) surrounded by the element isolation region ST and MISFET 101 is operated, electric field concentration is likely to occur in the vicinity of the boundary between the active region (MISFET formation region 1A) and the element isolation region ST. Therefore, the current tends to flow through the paths LP1, LP2 shown in FIG. 23, as compared with the path LP3 shown in FIG. 23. Here, each of the paths LP1, LP2 corresponds to a path through which a current (source-drain current) flows between the source region (n-type semiconductor region SR) and the drain region (n-type semiconductor region DR) of MISFET along the boundary between the active region (MISFET formation region 1A) and the element isolation region ST. Further, the path LP3 corresponds to a path through which a current flows between the source region (n-type semiconductor region SR) and the drain region (n-type semiconductor region DR) of MISFET, at a position a certain distance from the element isolation region ST (e.g., the center portion of MISFET formation region 1A in the Y direction).

In the first examined example, since the current is likely to flow through the paths LP1, LP2 than the path LP3, apparently, the threshold voltage of MISFET 101 becomes relatively small at the vicinity of the boundary between the active region (MISFET formation region 1A) and the element isolation region ST, as compared to a position some extent far from the element isolation region ST (e.g., the center portion of MISFET formation region 1A in the Y direction). That is, the threshold voltage of MISFET 101 (corresponding to MISFET 101 at the portion of the paths LP1, LP2 as the current path) at the vicinity of both end portions TB1, TB2 of MISFET formation region 1A in the Y direction is smaller than the threshold voltage of MISFET 101 (corresponding to MISFET 101 at the portion of the path LP3 as the current path) at the center portion of MISFET formation region 1A in the Y direction. In the present application, "the threshold voltage is large" means "the absolute value of the threshold voltage is large", and "the threshold voltage is small" means "the absolute value of the threshold voltage is small".

For this reason, in MISFET 101 of the first examined example, current concentration in the paths LP1, LP2 along the boundary between the active region (MISFET formation region 1A) and the element isolation region ST is feared. This can result in lowering performance of the semiconductor device including MISFET. To improve the performance of semiconductor device including MISFET, it is desirable to suppress the current concentration at the paths LP1, LP2.

Semiconductor device of the second examined example shown in FIGS. 26 to 28 differs from semiconductor device of the present embodiment in FIGS. 1 to 4 in the following respects. That is, in semiconductor device of the first examined example shown in FIGS. 26 to 28, the p-type halo regions HA1, HA2 are formed in the semiconductor substrate SB (p-type well PW) of MISFET formation region 1A, but the p-type halo regions HA1, HA2 are formed continuously from the end portion TB1 to the end portion TB2 of MISFET formation region 1A in the Y direction. That is, in the second examined example, the p-type halo regions HA1, HA2 are also formed in the center portion of MISFET formation region 1A in the Y direction. MISFET formed in the MISFET formation region 1A in the second examined example will be referred to as a MISFET 102 with reference numeral 201. Parts of the p-type halo regions HA1, HA2 are located under the gate electrode GE. The portions of the p-type halo regions HA1, HA2 located under the gate electrode GE, i.e., the portions of the p-type halo regions HA1, HA2 overlapping with the gate electrode GE in plan view, can function as a portion of the channel formation region. Therefore, when comparing MISFET 101 of the first examined example and MISFET 102 of the second examined example, the threshold voltage of MISFET 102 of the second examined example is larger than that of MISFET 101 of the first examined example. This is because, in the case of an n-channel MISFET, the higher the p-type impurity concentration in the channel formation region, the higher the threshold voltage of MISFET tends to be. Since each of the p-type halo regions HA1, HA2 has a p-type impurity concentration higher than that of the p-type well PW, the formation of the p-type halo regions HA1, HA2 act to increase the p-type impurity concentration of the portion formed by the p-type halo regions HA1, HA2 in the channel formation region and to increase the threshold voltage of MISFET. Therefore, in MISFET 102 of the second examined example, the threshold voltage can be made larger than that of MISFET 101 of the first examined example by forming the p-type halo regions HA1, HA2.

However, in the case of the second examined example of FIGS. 26 to 28 similarly to the first examined example illustrated in FIGS. 23 to 25, when MISFET 102 is operated, electric field concentration is likely to occur near the boundary between the active region (MISFET formation region 1A) and the element isolation region ST, and the current easily flows in the paths LP1, LP2 illustrated in FIG. 26 as compared with the path LP3 illustrated in FIG. 26. Therefore, even in the case of the second examined example, apparently, the threshold voltage of MISFET 102 is relatively small at the vicinity of the boundary between the active region (MISFET formation region 1A) and the element isolation region ST as compared with a position some extent far from the element isolation region ST (e.g., the center portion of MISFET formation region 1A in the Y direction). That is, the threshold voltage of MISFET 102 at the vicinity of both end portions TB1, TB2 of MISFET formation region 1A in the Y direction is smaller than the threshold voltage of MISFET 102 in the center portion of MISFET formation region 1A in the Y direction.

Therefore, also in MISFET 102 of the second examined example, current concentration in the paths LP1, LP2 along the boundary between the active region (MISFET formation region 1A) and the element isolation region ST is feared.

<Main Features and Effects>

Semiconductor device of the present embodiment includes a semiconductor substrate SB, a p-type well PW formed in MISFET formation region 1A of the semiconductor substrate SB, a gate electrode GE which is formed on the p-type well PW via a gate dielectric film and extends in the Y direction, and a source region (here n-type semiconductor region SR) and a drain region (here n-type semiconductor region DR) which are formed in the p-type well and spaced from each other in the X direction. The n-type semiconductor region SR includes an $n^-$ type semiconductor region EX1 and an $n^+$ type semiconductor region SD1 which is adjacent to the $n^-$ type semiconductor region EX1 and has an impurity concentration higher than that of the $n^-$ type semiconductor region EX1. The n-type semiconductor region DR includes an $n^-$ type semiconductor region EX2 and an $n^+$ type semiconductor region SD2 which is adjacent to the $n^-$ type semiconductor region EX2 and has an impurity concentration higher than the $n^-$ type semiconductor region EX2. The $n^-$ type semiconductor region EX1 and the $n^-$ type semiconductor region EX2 are spaced from each other in the X direction via a region directly below the gate element GE.

One of the main features of the present embodiment is that a p-type halo region HA1 adjacent to the $n^-$ type semiconductor region EX1 and a p-type halo region HA2 adjacent to the $n^-$ type semiconductor region EX1 are formed at the vicinity of both end portions TB1, TB2 of MISFET formation region 1A in the Y direction, and that p-type halo regions TB1, TB2 are not formed at the center portion of MISFET formation region 1A in the Y direction. Each of the p-type halo regions HA1, HA2 is a p-type region having an impurity concentration higher than that of the p-type well PW. The p-type halo region HA1 and the p-type halo region HA2 are spaced from each other in the X direction, and at least a portion of the p-type halo region HA1 and at least a portion of the p-type halo region HA2 are located under the gate electrode GE.

Since a portion of each of the p-type halo regions HA1, HA2 is located under the gate electrode GE (and thus overlaps with the gate electrode GE in plan view), portions of the p-type halo regions HA1, HA2 located under the gate electrode GE can function as a part of the channel formation region. Since each of the p-type halo regions HA1, HA2 has a p-type impurity concentration higher than that of the p-type well PW, the threshold voltage of MISFET can be increased when the p-type halo regions HA1, HA2 are formed, as described above with reference to the second examined example, as compared with the case where the p-type halo regions HA1, HA2 are not formed.

Therefore, in the present embodiment, since the p-type halo regions HA1, HA2 are formed at the vicinity of the both end portions TB1, TB2 of MISFET formation region 1A in the Y direction, the effect of increasing the threshold voltage of MISFET 1 by the p-type halo regions HA1, HA2 can be obtained. On the other hand, since the p-type halo regions HA1, HA2 are not formed at the center portion of MISFET formation region 1A in the Y direction, the effect of increasing the threshold voltage of MISFET 1 by the p-type halo regions HA1, HA2 cannot be obtained. This acts to increase the threshold voltage of MISFET 1 at the vicinity of both end portions TB1, TB2 of MISFET formation region 1A in the Y direction in comparison with the center portion of MISFET formation region 1A in the Y direction. Therefore, forming the p-type halo regions HA1, HA2 only at the vicinity of the both end portions TB1, TB2 of MISFET formation region 1A in the Y direction as in the present embodiment acts to suppress the current flowing through the paths LP1, LP2 as compared with the path LP3 shown in FIG. 1.

As described above with reference to the first examined example and the second examined example, when MISFET 1 is operated, electric field concentration tends to occur at the vicinity of the boundary between the active region (MISFET formation region 1A) and the element isolation region ST. This acts to increase the current flowing through the paths LP1, LP2 compared to the path LP3 shown in FIG. 1. In the present embodiment, the increase of current flowing through the paths LP1, LP2 by electric field concentration can be canceled by the effect that the current flowing through the paths LP1, LP2 is suppressed by forming p-type halo regions HA1, HA2 only at the vicinity of both end portions TB1, TB2 of MISFET formation region 1A in the Y direction. For this reason, in the present embodiment, by forming the p-type halo regions HA1, HA2 only at the vicinity of the both end portions TB1, TB2 of MISFET formation region 1A in the Y direction, it is possible to suppress or prevent current concentration from occurring in the paths LP1, LP2 along the boundary between the active region (MISFET formation region 1A) and the element isolation region ST. Therefore, it is possible to improve the performance of the semiconductor device including MISFET 1.

In the above-mentioned second examined example, since the effect of increasing the threshold voltage due to the formation of the p-type halo regions HA1, HA2 occurs in the entire MISFET 102, the effect of suppressing the current flowing through the above-mentioned paths LP1, LP2 is not obtained as compared with the effect of suppressing the current flowing through the path LP3 due to the formation of the p-type halo regions HA1, HA2. In the present embodiment, since the effect of increasing the threshold voltage of MISFET 1 due to the formation of the p-type halo regions HA1, HA2 occurs only at the vicinity of both end portions TB1, TB2 of MISFET formation region 1A in the Y direction, the effect of suppressing the current flowing through the paths LP1, LP2 can be obtained as compared with the above-mentioned path LP3 by the formation of the p-type halo regions HA1, HA2.

In the present embodiment, at the vicinity of both end portions TB1, TB2 of MISFET formation region 1A in the Y direction, the reduction effect of the threshold voltage that may occur due to the electric field concentration can be canceled by the increase effect of the threshold voltage obtained by forming the p-type halo regions HA1, HA2. On the other hand, at the center portion of MISFET formation region 1A in the Y direction, since the reduction effect of the threshold voltage due to the electric field concentration does not occur reflecting that the electric field concentration hardly occurs, p-type halo regions HA1, HA2 are not formed. Consequently, the threshold voltage of MISFET 1 at the vicinity of the both end portions TB1, TB2 of MISFET formation region 1A in the Y direction (that is, the threshold voltage at the paths LP1, LP2) can be made equal to or larger than the threshold voltage of MISFET 1 at the center portion of MISFET formation region 1A in the Y direction (that is, the threshold voltage at the path LP3).

In the first examined example, the threshold voltage of MISFET 101 is lower at the paths LP1, LP2 (the vicinity of both end portions TB1, TB2 of MISFET formation region 1A in the Y direction) than at the path LP3 (the center portion of MISFET formation region 1A in the Y direction). Therefore, the effective threshold voltage of the entire MISFET 101 is mainly determined by the threshold voltage of MISFET 101 at the paths LP1, LP2. Here, the relative accuracy of the threshold voltage of MISFET 101 at the path LP3 is improved in proportion to the $1/(LW)^{1/2}$ according to the Perigrom's law. Since L in this equation is the gate length and W in this equation is the gate width, according to the Perigrom's law, the greater the gate length and gate width, the greater the relative accuracy of the threshold voltage (i.e., the variation of the threshold voltage is reduced). However, the relative accuracy of the threshold voltage of MISFET 101 at the paths LP1, LP2 is independent of the gate width and does not improve even if the gate width becomes large. Therefore, in the case of the first examined example, the relative accuracy of the effective threshold voltage of MISFET 101 is not improved even if the gate-width is increased, since the effective threshold voltage of the entire MISFET 101 is mainly determined by the threshold voltage of MISFET 101 at the paths LP1, LP2. This can be a factor that reduces the relative accuracy of the threshold voltage of MISFET 101. This may also occur for the second examined example. This is because even in the second examined example, the threshold voltage of MISFET 102 is lower at the paths LP1, LP2 than at the path LP3, so that the effective threshold voltage of the entire MISFET 102 is mainly determined by the threshold voltage of MISFET 102 at the paths LP1, LP2.

On the other hand, in the present embodiment, by forming the p-type halo regions HA1, HA2 only at the vicinity of both end portions TB1, TB2 of MISFET formation region 1A in the Y direction, the threshold voltage of MISFET 1 at the paths LP1, LP2 can be made comparable to or larger than the threshold voltage of MISFET 1 at the path LP3. Thus, in the present embodiment, it is possible to prevent the effective threshold voltage of the entire MISFET 1 from being mainly determined by the threshold voltage of the MISFET 1 at the paths LP1, LP2. Further, it is more preferable that the threshold voltage of MISFET 1 at the vicinity of both end portions TB1, TB2 of MISFET formation region 1A in the Y direction (i.e., the threshold voltage at the paths LP1, LP2) is greater than the threshold voltage of MISFET 1 at the center portion of MISFET formation region 1A in the Y direction (i.e. the threshold voltage at the path LP3). This makes it possible to precisely suppress that the threshold voltage of MISFET 1 at the paths LP1, LP2 affects the effective threshold voltage of the entire MISFET 1. As a result, the relative accuracy of the effective threshold voltage of MISFET 1 can be improved proportionally to the $1/(LW)^{1/2}$ in accordance with the Perigrom's law. For example, as the gate width increases, the relative accuracy of the effective threshold voltage of MISFET 1 increases (the variation of the threshold voltage decreases). Therefore, it is possible to improve the performance of semiconductor device including MISFET 1.

The p-type halo regions HA1, HA2 may also act to reduce the relative accuracy of the threshold voltage. However, in the present embodiment, since the p-type halo regions HA1, HA2 are formed only at the vicinity of both end portions TB1, TB2 of MISFET formation region 1A in the Y direction, the effect of lowering the relative accuracy of the threshold voltage by the p-type halo regions HA1, HA2 occurs only at the vicinity of both end portions TB1, TB2 of MISFET formation region 1A in the Y direction. Therefore, in the present embodiment as compared with the second examined example, the degradation of the relative accuracy of the threshold voltage due to the formation of the p-type halo regions HA1, HA2 can be suppressed. Consequently, compared to the first examined example and the second examined example, the present embodiment can improve the relative accuracy of the effective threshold voltage of MISFET. Therefore, the performance of semiconductor device can be improved.

Figure 29:
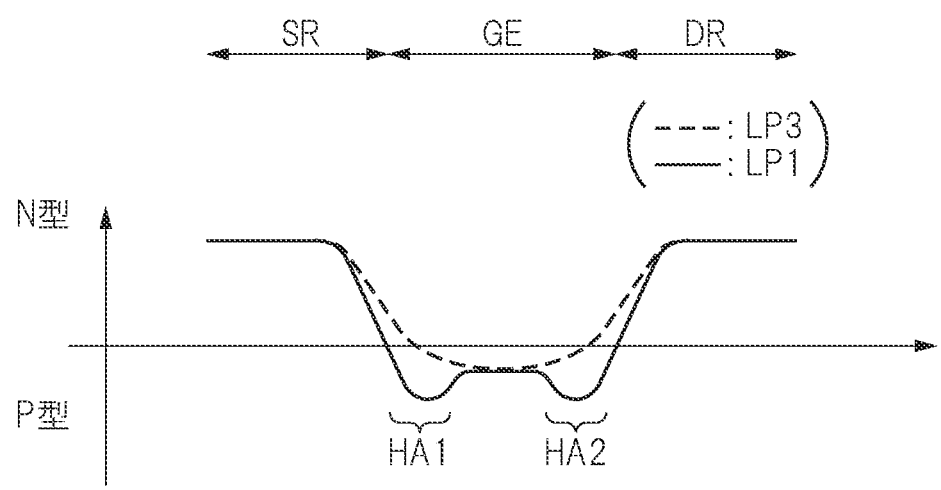
FIG. 29 is a graph showing an example of an impurity profile.

FIG. 29 is a graph showing an example of an impurity profile. In FIG. 29, the concentration distribution of the impurities along the path LP1 in FIG. 1 is shown by a solid line, and the concentration distribution of the impurities along the path LP3 is shown by a dotted line. The horizontal axis of the graph of FIG. 29 corresponds to the position in the X direction. The impurity concentration distribution along the path LP2 is the same as the impurity concentration distribution along the path LP1 (solid line). Further, in FIG. 29, the range indicated by reference numeral GE, substantially corresponds to the region directly below the gate electrode GE (channel formation region), the range indicated by reference numeral SR, substantially corresponds to the surface layer portion of the n-type semiconductor region SR, the range indicated by reference numeral DR, substantially corresponds to the surface layer portion of the n-type semiconductor region DR.

As can be seen from FIG. 29, in the path along the path LP1 (or path LP2), since the p-type halo regions HA1, HA2 are not formed, the p-type impurity concentration of the region directly below the gate electrode GE (channel formation region) becomes highest directly below the center of the gate electrode GE (center in the X direction), and the p-type impurity concentration gradually decreases from there toward both sidewalls of the gate electrode GE in the X direction. On the other hand, in the path along the path LP3, since the p-type halo regions HA1, HA2 are formed, the p-type impurity concentration of the region directly below the gate electrode GE (channel forming region) shows a minimum value directly below the center of the gate electrode GE (center in the X direction), and the p-type impurity concentration gradually increases from there toward the sidewalls of the gate electrode GE in the X direction, shows a peak once, and then gradually decreases. This peak reflects that the p-type impurity concentration of the p-type halo regions HA1, HA2 is higher than that of the p-type impurity concentration of the p-type well PW.

Forming the p-type halo regions HA1, HA2 acts to increase the p-type impurity concentration at both end portions of the channel formation region (at both end portions in the X direction). Therefore, in the present embodiment, the p-type impurity concentration at both end portions of the channel formation region (both end portions in the X direction) is higher at both end portions TB1, TB2 of MISFET formation region 1A in the Y direction than at the center portion of the MISFET formation region 1A in the Y direction.

Next, a preferable formation range of the p-type halo regions HA1, HA2 will be described. At the end portion TB1 of MISFET formation region 1A, the p-type halo regions HA1a, HA2a are in contact with the element isolation region ST, and at the end portion TB2 of MISFET formation region 1A, the p-type halo regions HA1b, HA2b are in contact with the element isolation region ST It is preferable that the p-type halo regions HA1, HA2 are formed within a range of 0.5 μm from both end portions TB1, TB2 of MISFET formation region 1A in the Y direction. In other words, it is preferable that the p-type halo regions HA1a, HA2a are formed within a range within 0.5 μm from the end portion TB1 of MISFET formation region 1A in the Y direction, and it is preferable that the p-type halo regions HA1b, HA2b are formed within a range within 0.5 μm from the end portion TB2 of MISFET formation region 1A in the Y direction. As a result, it is possible to more accurately suppress the degradation of the relative accuracy of the threshold voltage due to the formation of the p-type halo regions HA1, HA2. Consequently, the relative accuracy of the effective threshold voltage of MISFET can be improved.

Further, it is preferable that the p-type halo regions HA1, HA2 are formed over 0.1 μm or more from both end portions TB1, TB2 of MISFET formation region 1A in the Y direction. In other words, it is preferable that the p-type halo regions HA1a, HA2a are formed over 0.1 μm or more from the end portion TB1 of MISFET formation region 1A in the Y direction, and it is preferable that the p-type halo regions HA1b, HA2b are formed over 0.1 μm or more from the end portion TB2 of MISFET formation region 1A in the Y direction. Thus, at the vicinity of both end portions TB1, TB2 of MISFET formation region 1A in the Y direction, the reduction effect of the threshold voltage that may occur due to the electric field concentration can be effectively canceled by increase effect of the threshold voltage obtained by forming the p-type halo regions HA1, HA2, it is possible to more accurately suppress or prevent the occurrence of current concentration in the paths LP1, LP2.

Therefore, it is preferable that the dimension (length) L2 of each of the p-type halo regions HA1a, HA1b, HA2a, HA2b in the Y direction is 0.1 μm or more and 0.5 μm or less (i.e., 0.1 μm≤L2≤0.5 μm) (see FIG. 2).

Second Embodiment

The present second embodiment is modified example of method of manufacturing semiconductor device of the above first embodiment. This second embodiment is mainly different from the above first embodiment in that, in the present second embodiment, ion implantation IM1 for forming the n⁻ semiconductor regions EX1, EX2 and ion implantation IM2 for forming the p-type halo regions HA1, HA2 are performed with the common photoresist pattern PR3 formed on the semiconductor substrate SB. Referring to FIGS. 30-42, method of manufacturing a semiconductor device of the present second embodiment will be described.

Figure 30:
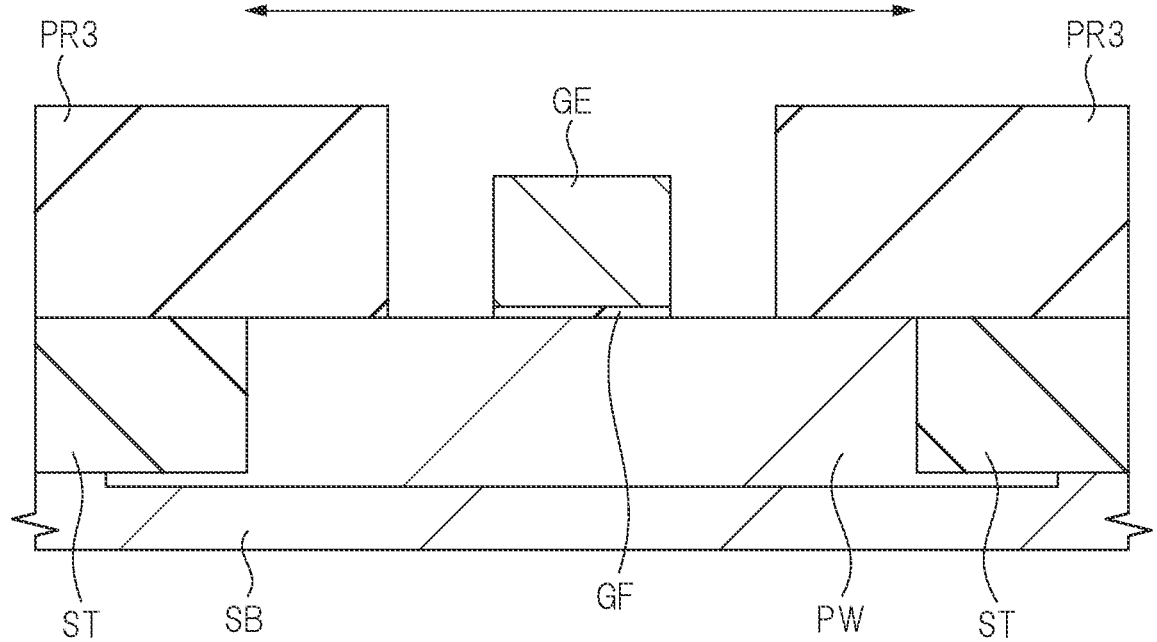
FIG. 30 is a main portion cross-sectional view during a manufacturing process of a semiconductor device of another embodiment.
Figure 31:
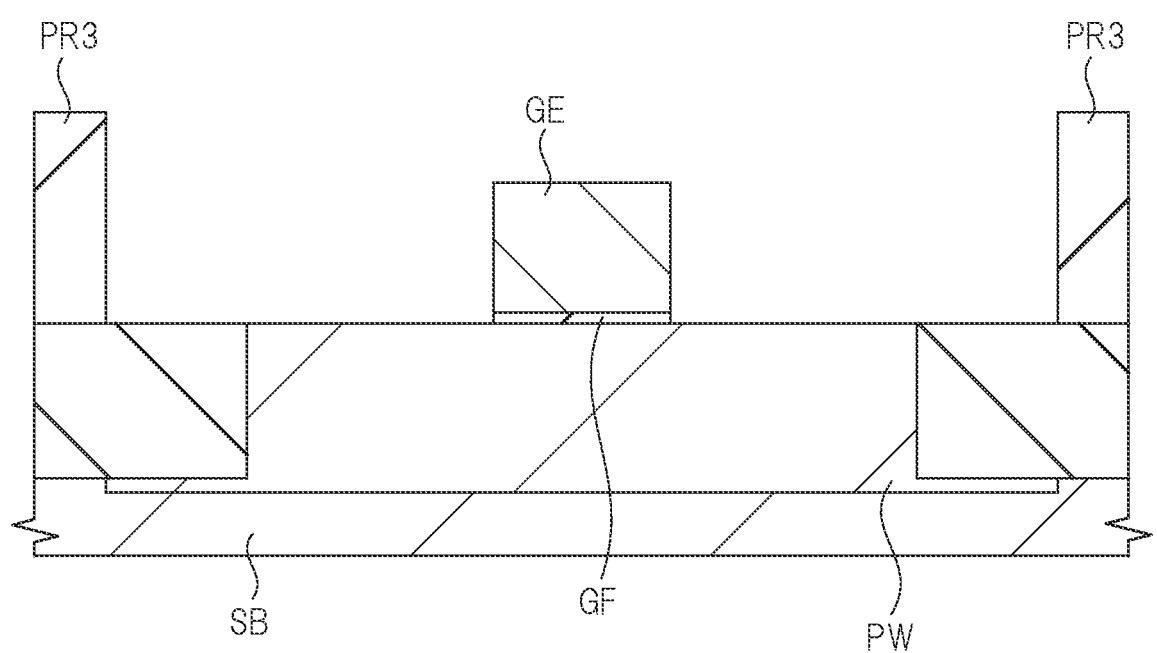
FIG. 31 is a main portion cross-sectional view during the same manufacturing process of the semiconductor device as in FIG. 30.
Figure 32:
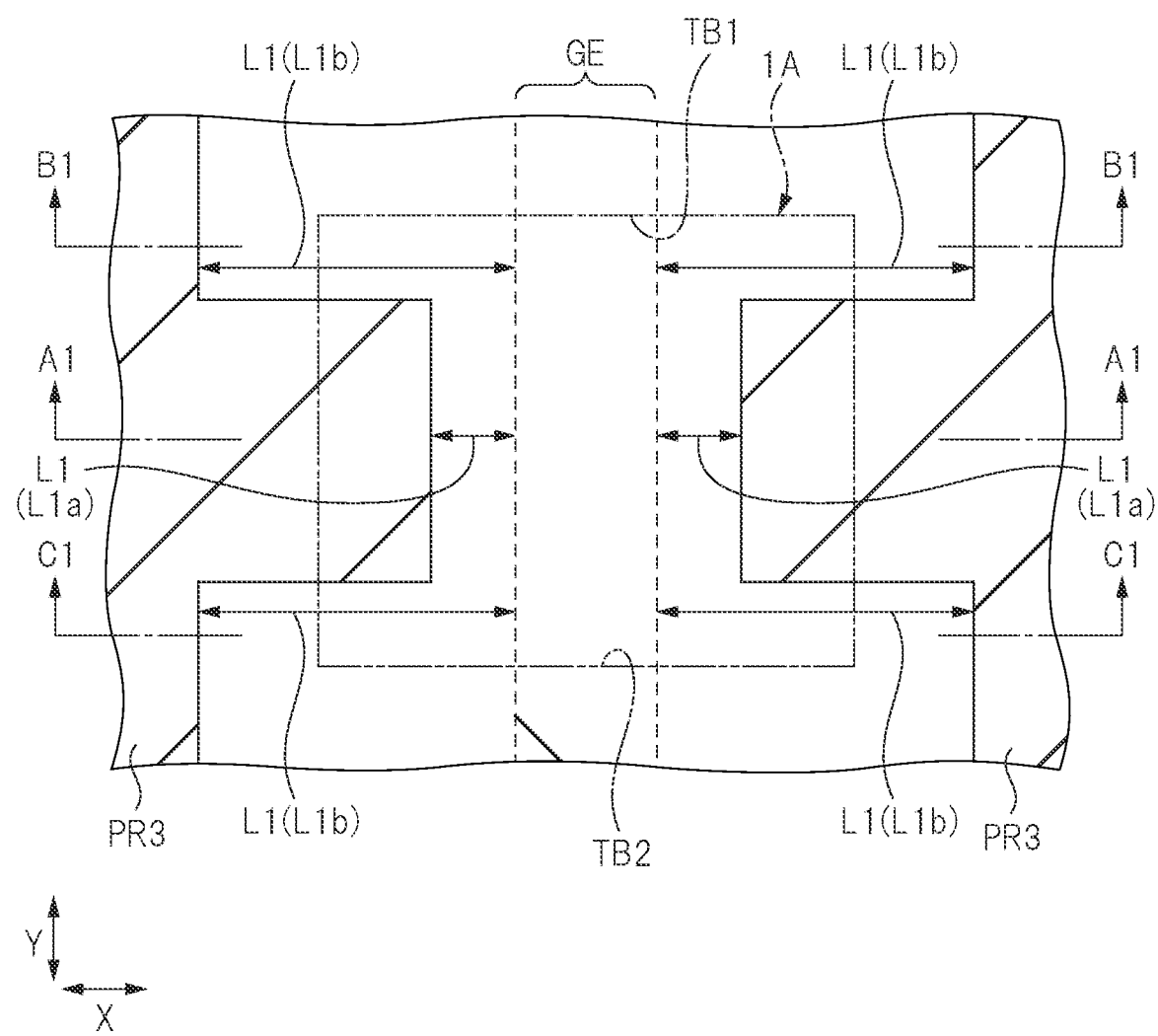
FIG. 32 is a main portion plan view during the same manufacturing process of the semiconductor device as in FIG. 30.

FIGS. 30-42 are main portion cross-sectional view or main portion plan view during the manufacturing process of semiconductor device of the present second embodiment. Of these, FIGS. 30, 33, 36, 39 and 41 show a cross section substantially corresponding to FIG. 3 (cross section at the position of A1-A1 line in FIG. 1 and FIG. 2), and FIGS. 31, 34, 37, 40 and 42 show a cross section substantially corresponding to FIG. 4 (cross section at the position of B1-B1 line or C1-C1 line in FIG. 1 and FIG. 2). FIGS. 32, 35 and 38 are main portion plan views, and the photoresist pattern PR3 is hatched, the formation position of the gate electrode GE is shown by dotted lines, MISFET formation region 1A is shown by a two-dot chain line. Cross-sectional view at the position of A1-A1 line in FIG. 32 corresponds to FIG. 30, and cross-sectional view at the position of B1-B1 line or C1-C1 line in FIG. 32 corresponds to FIG. 31. Also, cross-sectional view at the position of A1-A1 line in FIG. 35 corresponds to FIG. 33, and cross-sectional view at the position of B1-B1 line or C1-C1 line in FIG. 35 corresponds to FIG. 34. Also, cross-sectional view at the position of A1-A1 line in FIG. 38 corresponds to FIG. 36, and cross-sectional view at the position of B1-B1 line or C1-C1 line in FIG. 38 corresponds to FIG. 37.

Since the present second embodiment is also the same as the first embodiment described above until the structure of FIGS. 7 and 8 is obtained by performing up to the gate electrode formation process, repetitive descriptions thereof are omitted here. After obtaining the structure of FIGS. 7 and 8 in the same manner as described above in the first embodiment, in the present second embodiment, a photoresist pattern (resist pattern) PR3 is formed on the semiconductor substrate SB using a photolithography technique, as shown in FIGS. 30 to 32.

Figure 33:
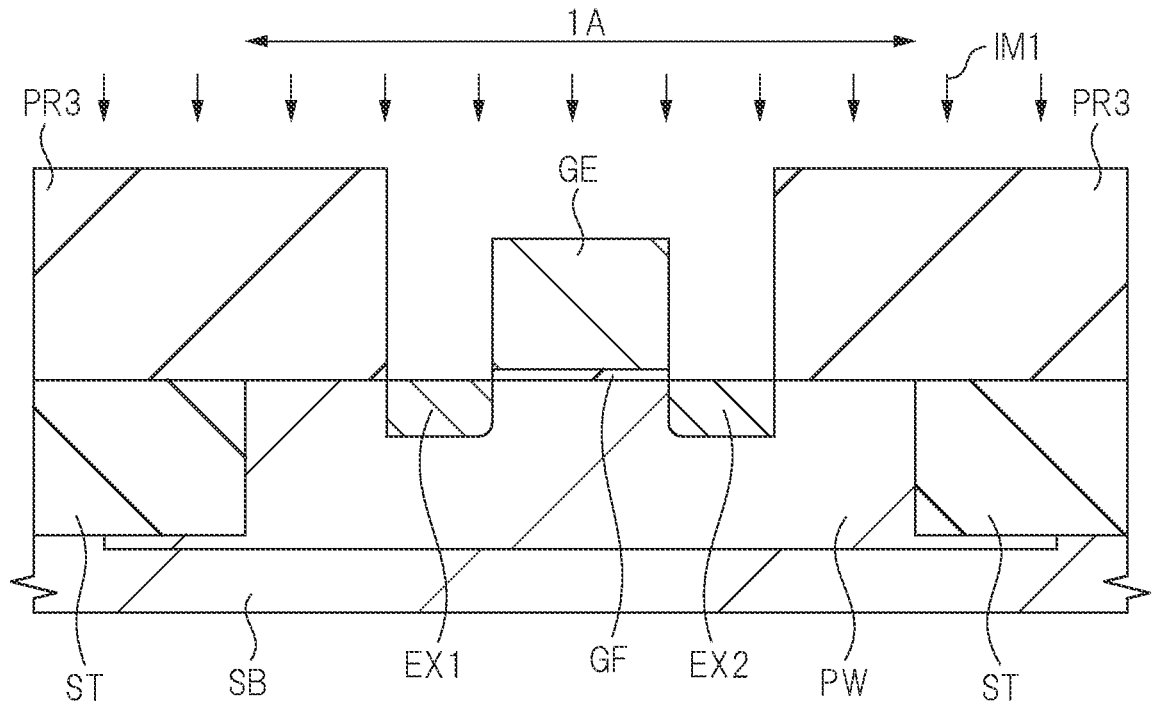
FIG. 33 is a main portion cross-sectional view during a manufacturing process of the semiconductor device following FIG. 30.
Figure 34:
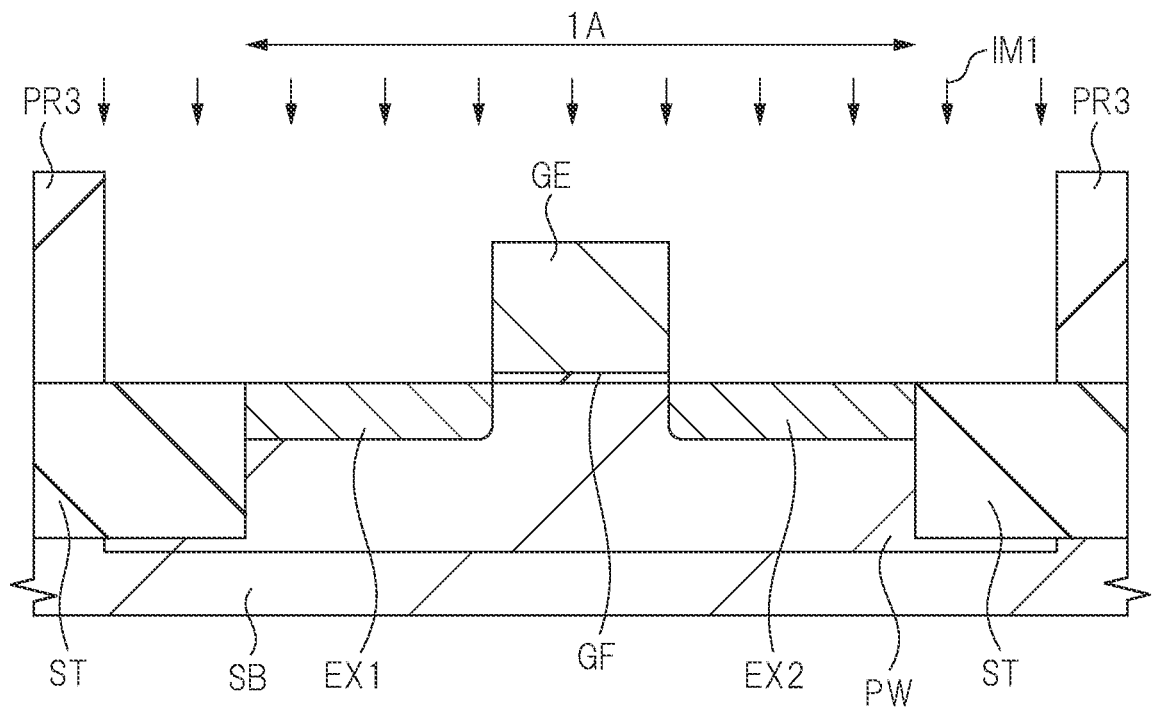
FIG. 34 is a main portion cross-sectional view during the same manufacturing process of the semiconductor device as in FIG. 33.
Figure 35:
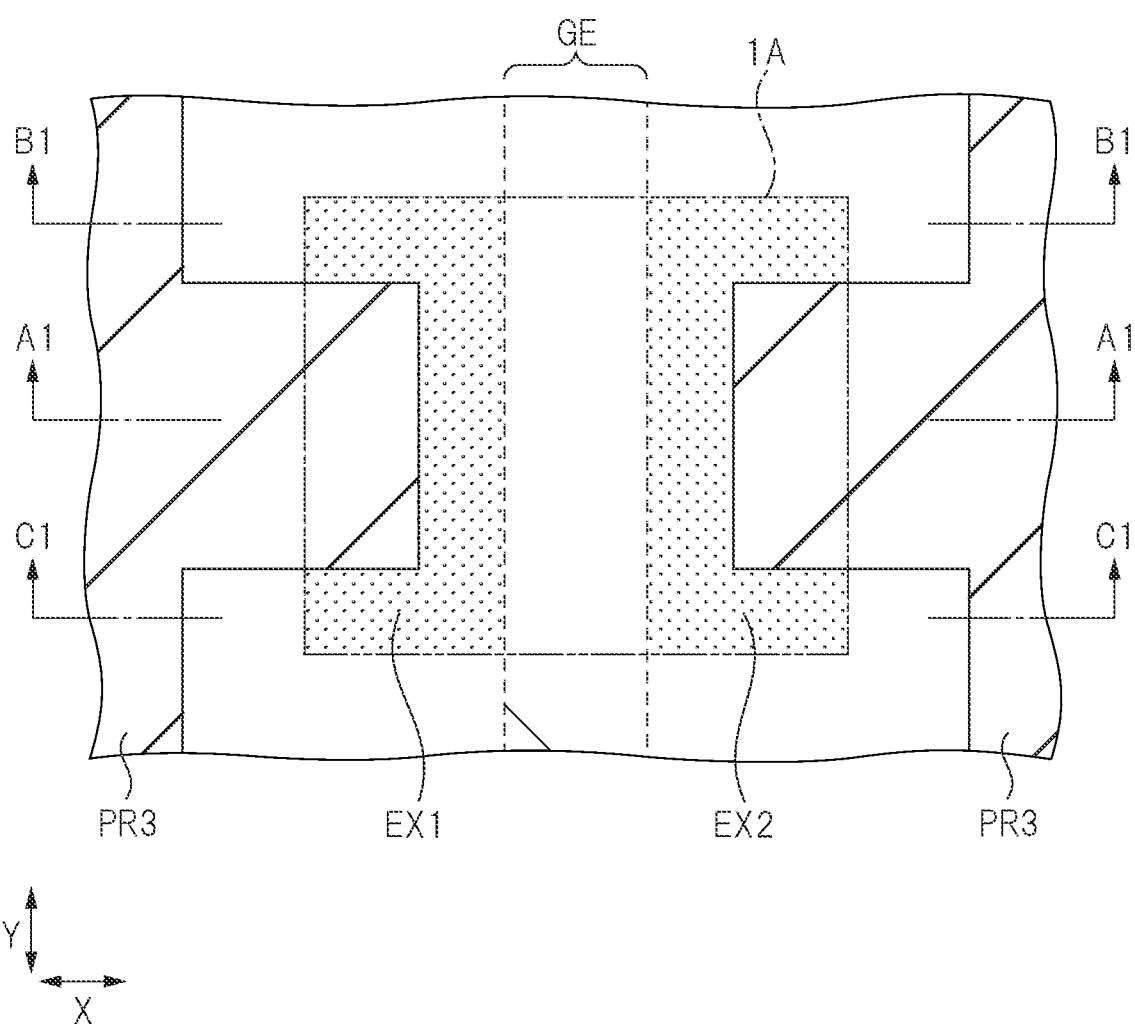
FIG. 35 is a main portion plan view during the same manufacturing process of the semiconductor device as in FIG. 33.

Next, as shown in FIGS. 33 to 35, n-type impurities such as phosphorus (P) or arsenic (As) are ion-implanted into regions on both sides of the gate electrode GE in the semiconductor substrate SB (p-type well PW) of MISFET formation region 1A to form an n⁻ type semiconductor regions EX1, EX2. This ion implantation IM1 is schematically shown by arrows in FIGS. 33 and 34. It is preferable that the ion implantation IM1 uses vertical ion implantation rather than oblique ion implantation.

The photoresist pattern PR3 is spaced in the X direction from the gate electrode GE on the semiconductor substrate SB of MISFET formation region 1A. That is, the gate electrode GE on the semiconductor substrate SB of MISFET formation region 1A is not covered by the photoresist pattern PR3, the sidewalls of the photoresist pattern PR3 and the sidewalls of the gate electrode GE are spaced by a predetermined distance. Therefore, in the ion implantation IM1 to which the vertical ion implantation is applied, n-type impurities may be implanted into semiconductor substrate SB (p-type well PW) of MISFET formation region 1A between the photoresist pattern PR3 and the gate electrode GE. Therefore, $n^-$ semiconductor regions EX1, EX2 can be formed in a region on both sides of the gate electrode GE in the semiconductor substrate SB (p-type well PW) of MISFET formation region 1A. The $n^-$ semiconductor regions EX1, EX2 are formed not only at the vicinity of both end portions TB1, TB2 of MISFET formation region 1A in the Y direction, but also at the center portion of MISFET formation region 1A in the Y direction.

Figure 36:
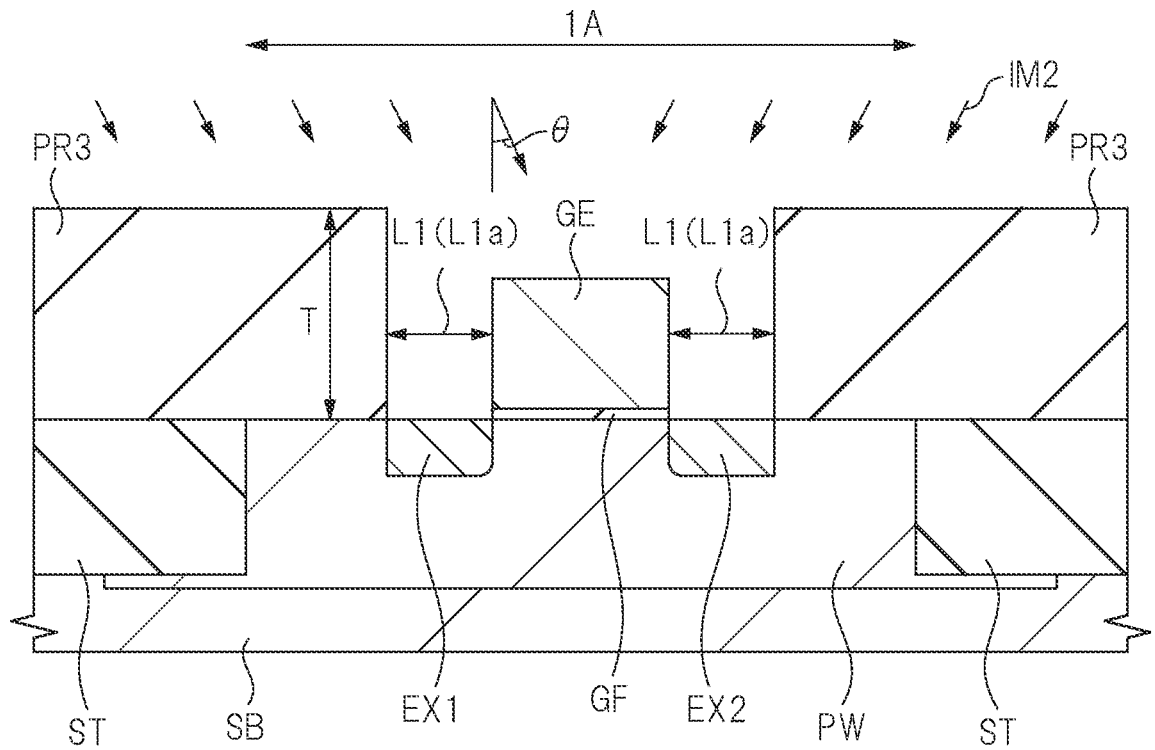
FIG. 36 is a main portion cross-sectional view during a manufacturing process of the semiconductor device following FIG. 33.
Figure 37:
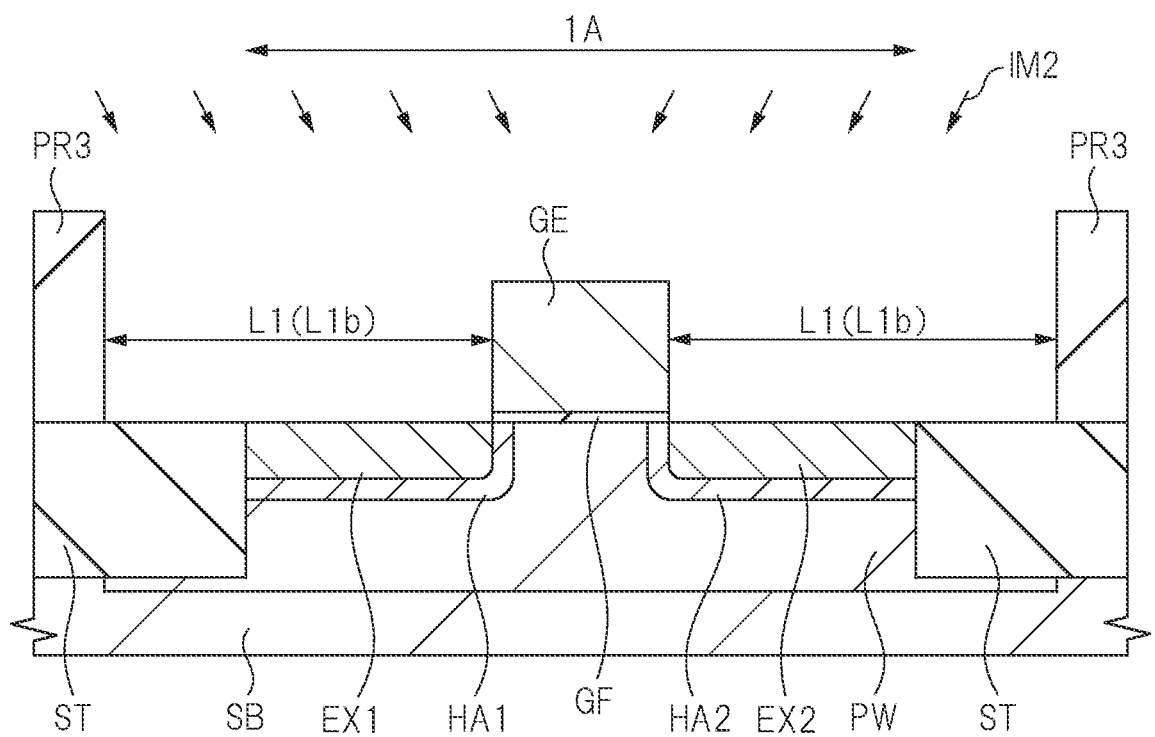
FIG. 37 is a main portion cross-sectional view during the same manufacturing process of the semiconductor device as in FIG. 36.
Figure 38:
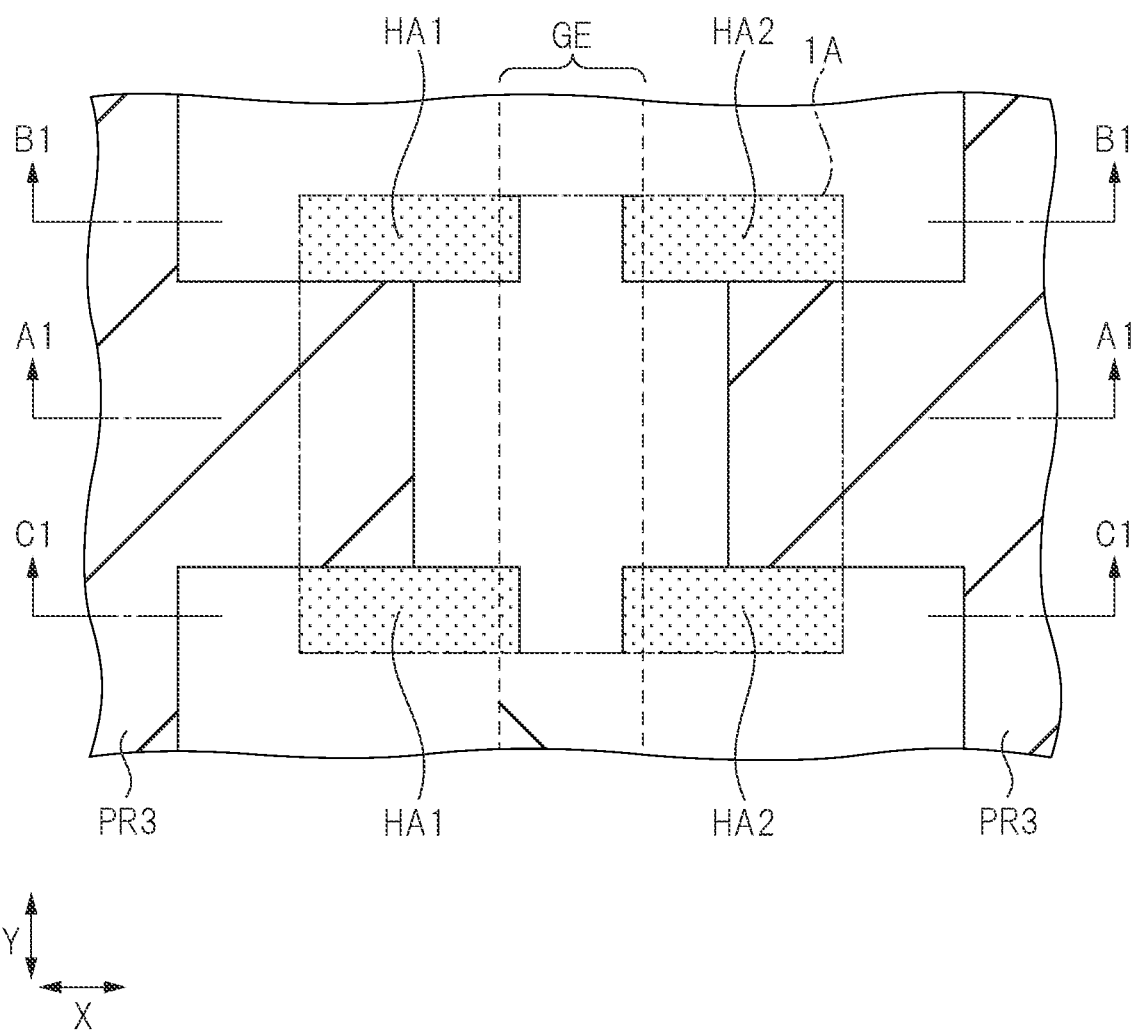
FIG. 38 is a main portion plan view during the same manufacturing process of the semiconductor device as in FIG. 36.

Next, as shown in FIGS. 36 to 38, p-type halo regions HA1, HA2 are formed by ion-implanting p-type impurities such as boron (B) into the semiconductor substrate SB (p-type well PW) of MISFET formation region 1A. This ion implantation IM2 is schematically shown by arrows in FIGS. 36 and 37. The ion implantation IM2 applies oblique ion implantation.

A distance L1 between the photoresist pattern PR3 and the gate electrode GE (distance in the X direction) is smaller at the center portion of MISFET formation region 1A in the Y direction than at the vicinity of both end portions TB1, TB2 of MISFET formation region 1A in the Y direction. That is, $L1a<L1b$ is satisfied. Here, as shown in FIG. 32, the distance L1a corresponds to the distance between the photoresist pattern PR3 and the gate electrode GE (distance in the X direction) at the center portion of MISFET formation region 1A in the Y direction. Also, the distance L1b corresponds to the distance between the photoresist pattern PR3 and the gate electrode GE (distance in the X direction) at the vicinity of both end portions TB1, TB2 of MISFET formation region 1A in the Y direction.

In ion implantation IM2, oblique ion implantation is applied. At this time, in a location where the distance L1 between the photoresist pattern PR3 and the gate electrode GE is large (i.e., at the vicinity of both end portions TB1, TB2 of MISFET formation region 1A in the Y direction), between the photoresist pattern PR3 and the gate electrode GE, p-type impurity ions can be obliquely implanted into the semiconductor substrate SB of MISFET formation region 1A (p-type well PW). Therefore, p-type halo regions HA1, HA2 are formed at the vicinity of both end portions TB1, TB2 of MISFET formation region 1A in the Y direction (thus at the vicinity of the element isolation region ST in the Y direction).

However, in a location where the distance L1 between the photoresist pattern PR3 and the gate electrode GE is small (i.e., at the center portion of MISFET formation region 1A in the Y direction), between the photoresist pattern PR3 and the gate electrode GE, p-type impurity ions are not obliquely implanted into the semiconductor substrate SB (p-type well PW) by the shielding effect of the photoresist pattern PR3. Therefore, the p-type halo regions HA1, HA2 are not formed at the center portion of MISFET formation region 1A in the Y direction (thus at the region far from the element isolation region ST in the Y direction).

The distance L1b should be set to a value that the photoresist pattern PR3 can shield implantation of p-type impurity ions in the semiconductor substrate SB (p-type well PW) between the photoresist pattern PR3 and the gate electrode GE. Specifically, the distance L1b is set so that the following equation 1 holds.

$$\mathrm{Tan}(\theta) \times T \geq L1b \qquad \text{Equation 1}$$

Here, θ in the equation 1 is the inclination angle of the ion implantation IM2, specifically, corresponds to the angle at which the traveling direction of impurity ions with respect to the semiconductor substrate SB is inclined with respect to the normal direction of the main surface of the semiconductor substrate SB. Also, T in the equation 1 is the thickness (height) of the photoresist pattern PR3.

In a location where the distance L1 between the photoresist pattern PR3 and the gate electrode GE in the X direction is set to a distance L1b so as to satisfy the equation 1, impurity ions by the ion implantation IM2 is not implanted into the semiconductor substrate SB (p-type well PW) between the photoresist pattern PR3 and the gate electrode GE by being shielded by the photoresist pattern PR3.

On the other hand, the distance L1a needs to be set to a value that the photoresist pattern PR3 does not shield the implantation of p-type impurity ions into the semiconductor substrate SB (p-type well PW) between the photoresist pattern PR3 and the gate electrode GE. Specifically, the distance L1a is set so that the following equation 2 holds.

$$\mathrm{Tan}(\theta) \times T < L1b \qquad \text{Equation 2}$$

θ and T in the equation 2 are similar to θ and T in equation 1.

In a location where the distance L1 between the photoresist pattern PR3 and the gate electrode GE in the X direction is set to a distance L1a so as to satisfy the equation 2, impurity ions by the ion implantation IM2 can be implanted into the semiconductor substrate SB (p-type well PW) between the photoresist pattern PR3 and the gate electrode GE.

Accordingly, each of the $n^-$ type semiconductor region EX1 and the $n^-$ type semiconductor region EX2 is continuously formed from the end portion TB1 to the end portion TB2 of MISFET formation region 1A in the Y direction. On the other hand, the p-type halo regions HA1, HA2 are formed at the vicinity of both end portions TB1, TB2 of MISFET formation region 1A in the Y direction, but the p-type halo regions HA1, HA2 are not formed at the center portion of MISFET formation region 1A in the Y direction.

After the ion implantation IM1 for forming the n-semiconductor regions EX1, EX2 and the ion implantation IM2 for forming the p-type halo regions HA1, HA2 are performed while the photoresist pattern PR3 is formed on the semiconductor substrate SB, the photoresist pattern PR3 is removed by ashing or the like.

Further, as a preferable embodiment, the case where the $n^-$ type semiconductor regions EX1, EX2 are first formed and then the p-type halo regions HA1, HA2 are formed has been described, but as another embodiment, it is also possible to form the $n^-$ type semiconductor regions EX1, EX2 after forming the p-type halo regions HA1, HA2 first. However, the ion implantation IM1 for forming the $n^-$ semiconductor regions EX1, EX2 and the ion implantation IM2 for forming the p-type halo regions HA1, HA2 need to be performed at least after forming the gate electrode GE and prior to forming the sidewall spacers SW on the sidewalls of the gate electrode GE.

Figure 39:
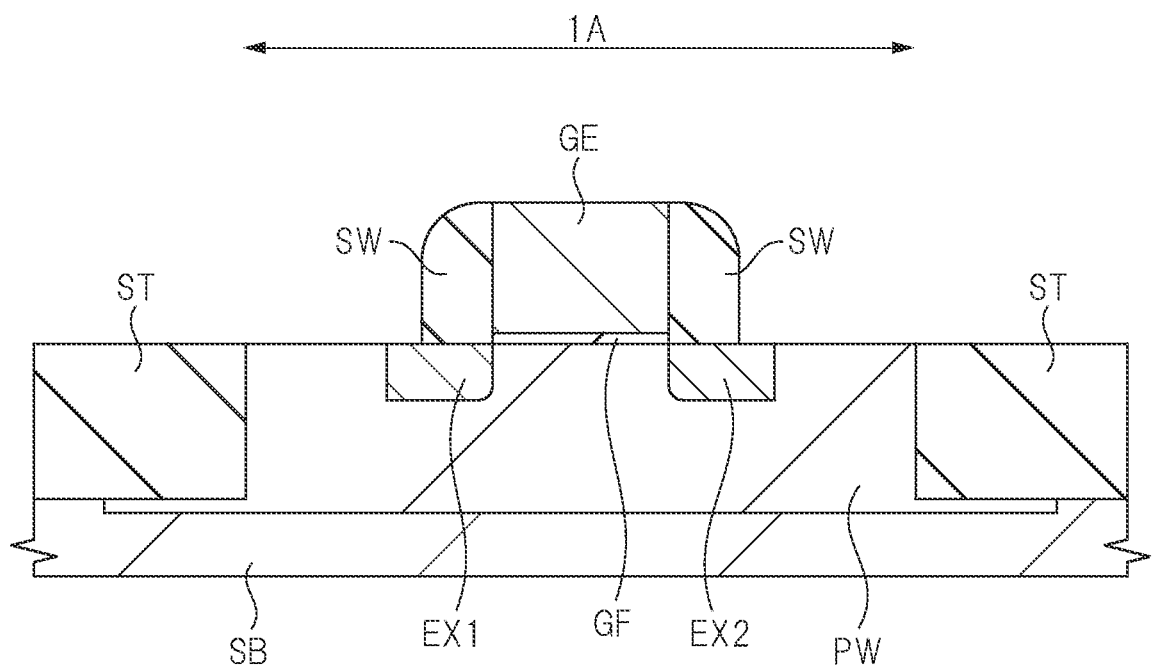
FIG. 39 is a main portion cross-sectional view during a manufacturing process of the semiconductor device following FIG. 36.
Figure 40:
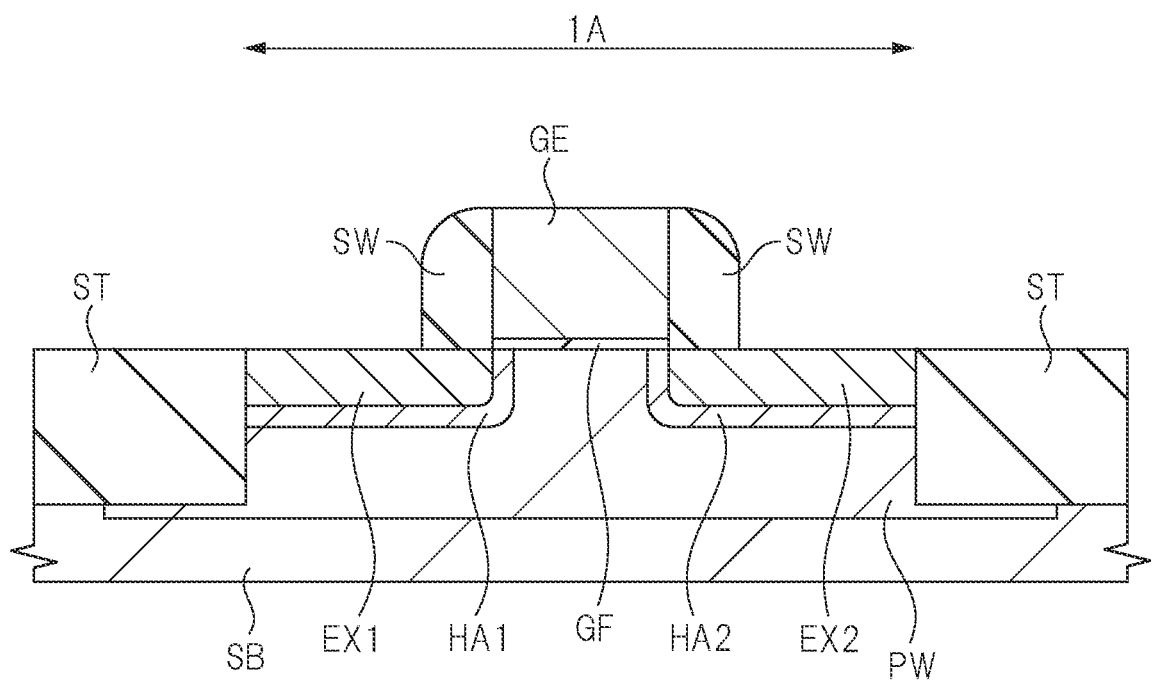
FIG. 40 is a main portion cross-sectional view during the same manufacturing process of the semiconductor device as in FIG. 39.
Figure 41:
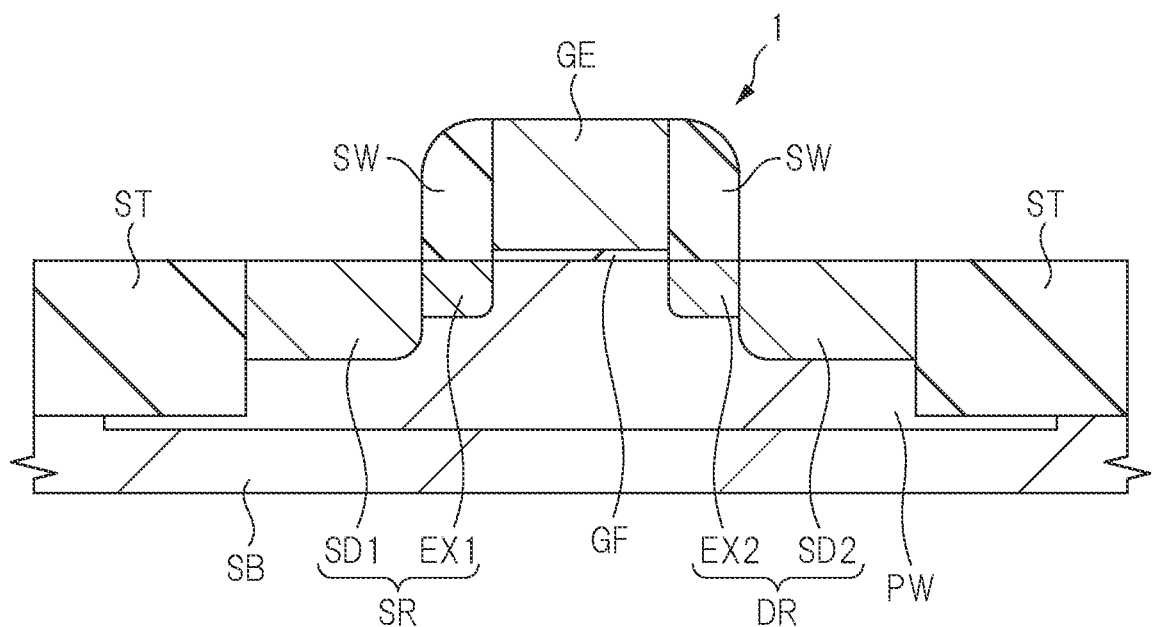
FIG. 41 is a main portion cross-sectional view during a manufacturing process of the semiconductor device following FIG. 39.
Figure 42:
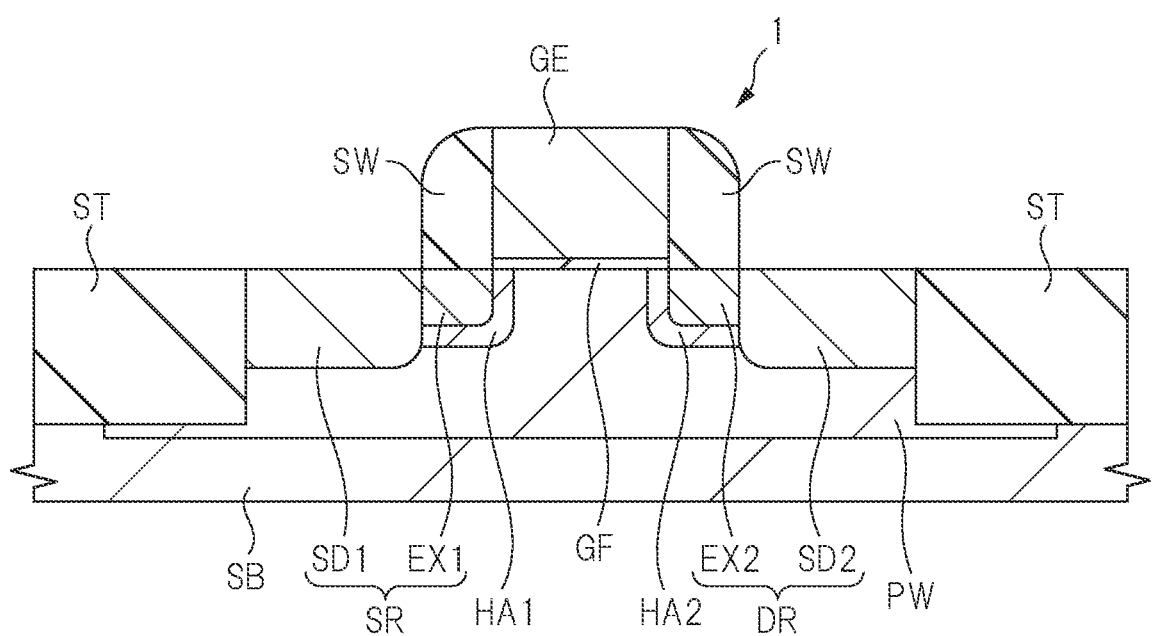
FIG. 42 is a main portion cross-sectional view during the same manufacturing process of the semiconductor device as in FIG. 41.

The subsequent steps are the same as those of the above-mentioned first embodiment in the present second embodiment. That is, as shown in FIGS. 39 and 40, sidewall spacers SW are formed on the sidewalls of the gate electrode GE. Then, as shown in FIGS. 41 and 41, the ion implantation IM3 is performed to form the n⁺ type semiconductor regions SD1, SD2. Then, if necessary, activation annealing is performed which is a heat treatment for activating impurities implanted by the ion implantation so far. In this manner, a MISFET 1 is formed.

Thereafter, the process of forming the metal silicide layers SL and the subsequent steps are performed in the same manner as in the above first embodiment, but the illustration and explanation thereof are omitted here.

In the present second embodiment, ion implantation IM1 for forming the n⁻ semiconductor regions EX1, EX2 and ion implantation IM2 for forming the p-type halo regions HA1, HA2 are performed with the common photoresist pattern PR3 formed on the semiconductor substrate SB. Thus, it is possible to reduce the number of manufacturing steps of semiconductor device. Further, it is possible to reduce the number of photomasks used in the photolithography process. Therefore, it is possible to suppress the manufacturing cost of semiconductor device. It also reduces semiconductor device manufacturing times and improves throughput.

Third Embodiment

Figure 43:
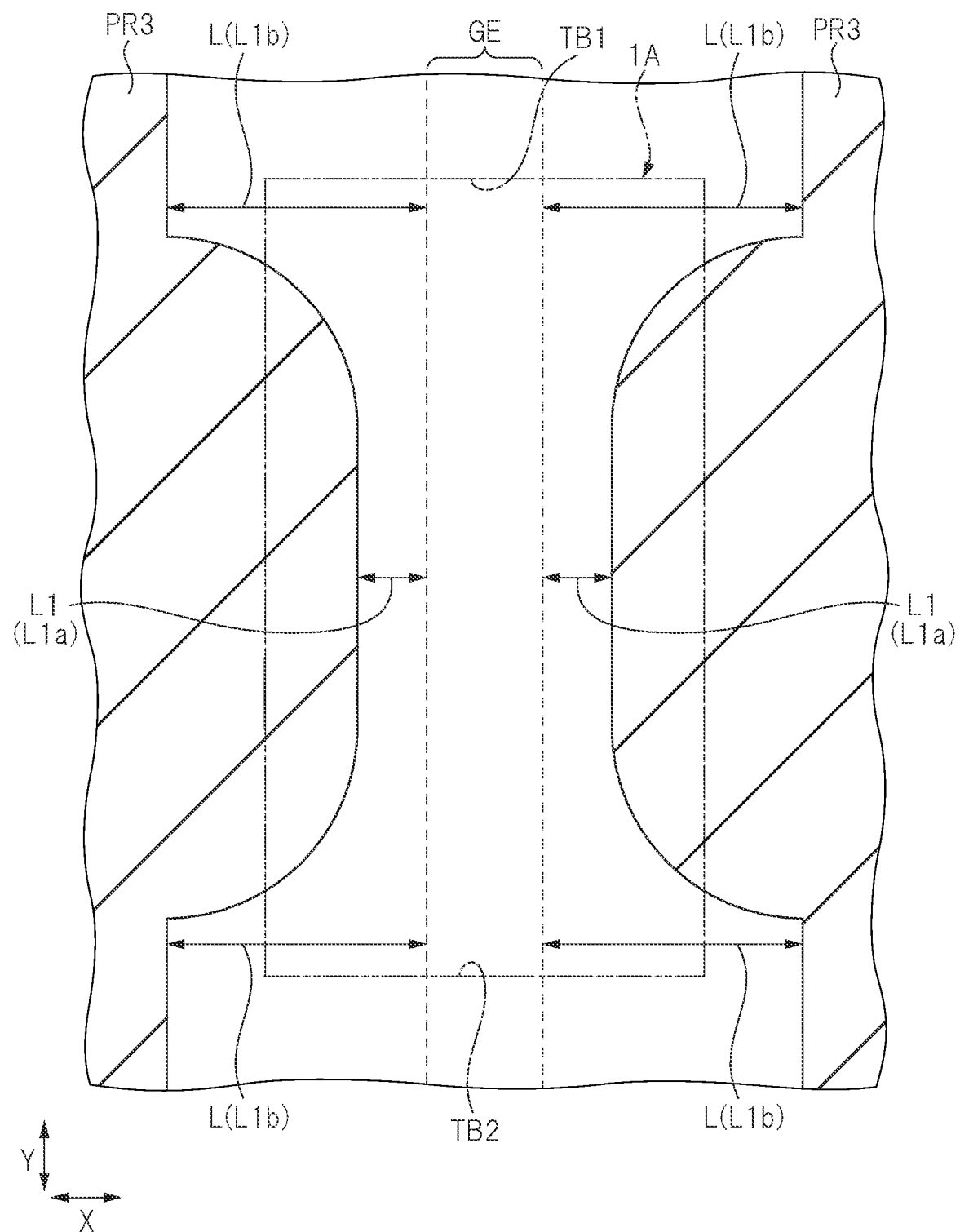
FIG. 43 is a main portion plan view during a manufacturing process of a semiconductor device of another embodiment.

FIG. 43 is a main portion plan view during the manufacturing process of semiconductor device of present third embodiment. FIG. 43 is a main portion plan view corresponding to FIG. 32 above, the photoresist pattern PR3 is hatched, the formation position of the gate electrode GE is shown by a dotted line, and MISFET formation region 1A is shown by a two-dot chain line. Cross-sectional view at the position of A1-A1 line in FIG. 43 is the same as that in FIG. 30, and cross-sectional view at the position of B1-B1 line and C1-C1 line in FIG. 43 is the same as that in FIG. 31.

The present third embodiment is a modified example of the photoresist pattern PR3 used in the above second embodiment. The photoresist pattern PR3 in the present third embodiment differs from the photoresist pattern PR3 in the second embodiment mainly in the following points.

That is, as shown in FIG. 32, in the photoresist pattern PR3 of the above second embodiment, a region where the distance L1 between the photoresist pattern PR3 and the gate electrode GE is a distance L1a and a region where the distance L1 between the photoresist pattern PR3 and the gate electrode GE is a distance Lib are adjacent in the Y direction.

In contrast, in the photoresist pattern PR3 of the present third embodiment shown in FIG. 43, in the Y direction, a region where a distance L1 between the photoresist pattern PR3 and the gate electrode GE is gradually changed from a distance L1a to a distance Lib is interposed between a region where the distance L1 between the photoresist pattern PR3 and the gate electrode GE is a distance L1a and a region where the distance L1 between the photoresist pattern PR3 and the gate electrode GE is a distance Lib. In the case of FIG. 43, in the region where the distance L1 between the photoresist pattern PR3 and the gate electrode GE is gradually changed from a distance L1a to a distance Lib, the distance L1 is changed in an arc shape from the distance L1a to the distance Lib.

Similarly to the above second embodiment, in the present third embodiment, when applying oblique ion implantation as the ion implantation IM2, p-type impurities are implanted into the semiconductor substrate SB (p-type well PW) between the photoresist pattern PR3 and the gate electrode GE in a location where the distance L1 between the photoresist pattern PR3 and the gate electrode GE in the X direction is a distance L1b. On the other hand, in a location where the distance L1 between the photoresist pattern PR3 and the gate electrode GE in the X direction is a distance L1a, p-type impurities are not implanted into the semiconductor substrate SB (p-type well PW) between the photoresist pattern PR3 and the gate electrode GE. Therefore, similarly to the above second embodiment, also in the present third embodiment, the p-type halo regions HA1, HA2 are formed at the vicinity of both end portions TB1, TB2 of MISFET formation region 1A in the Y direction. The p-type halo regions HA1, HA2 are not formed at the center portion of MISFET formation region 1A in the Y direction.

Further, in the photoresist pattern PR3 of the present third embodiment, a region where the distance L1 between the photoresist pattern PR3 and the gate electrode GE gradually changes from a distance L1a to a distance Lib is provided. As a result, the region in which the p-type halo regions HA1, HA2 are formed at the vicinity of the both end portions TB1, TB2 of MISFET formation region 1A in the Y direction can be gradually shifted to the region in which the p-type halo regions HA1, HA2 are not formed at the center portion of MISFET formation region 1A in the Y direction. Therefore, the threshold voltage of MISFET 1 is relatively gradually changed between the region where the threshold voltage of MISFET is large (at the vicinity of both end portions TB1, TB2 of MISFET formation region 1A in the Y direction) and the region where the threshold voltage of MISFET 1 is small (at the center portion of MISFET formation region 1A in the Y direction). Therefore, in the entire MISFET formation region 1A, it is easy to relax the electric field concentration.

The invention made by the present inventor has been described above in detail based on the embodiment, but the present invention is not limited to the embodiment described above, and it is needless to say that various modifications can be made without departing from the gist thereof.

What is claimed is:

1. A semiconductor device including a MISFET, the semiconductor device comprising:
    a semiconductor substrate having a main surface, an element isolation region embedded in a trench of the main surface, and an active region surrounded by the element isolation region;
    a well region of a first conductivity type, the well region being formed in the active region of the semiconductor substrate;
    a gate electrode of the MISFET, the gate electrode being formed on the well region of the semiconductor substrate via a gate dielectric film and extending in a first direction; and
    a source region of the MISFET and a drain region of the MISFET, each of the source region and the drain region being formed in the well region, having a second conductivity type opposite the first conductivity type and spaced from each other in a second direction perpendicular to the first direction,
    wherein the source region includes:
        a first semiconductor region; and
        a first high concentration region adjacent to the first semiconductor region and having an impurity concentration higher than that of the first semiconductor region,
    wherein the drain region includes:
        a second semiconductor region; and
        a second high concentration region adjacent to the second semiconductor region and having an impurity concentration higher than that of the second semiconductor region, wherein the first semiconductor region and the second semiconductor region are spaced from each other in the second direction via a region directly below the gate electrode, wherein a first region of the first conductivity type is formed in the well region and is in contact with the first semiconductor region and the element isolation region, wherein a second region of the first conductivity type is formed in the well region and is in contact with the first semiconductor region and the element isolation region, wherein the first region and the second region are spaced apart from each other in the first direction, wherein a third region of the first conductivity type is formed in the well region and is in contact with the second semiconductor region and the element isolation region, wherein a fourth region of the first conductivity type is formed in the well region and is in contact with the second semiconductor region and the element isolation region, wherein the third region and the fourth region are spaced apart from each other in the first direction, wherein the first region and the third region are spaced apart from each other in the second direction, and each has an impurity concentration higher than that of the well region, wherein the second region and the fourth region are spaced from each other in the second direction, and each has an impurity concentration higher than that of the well region, and wherein at least a portion of the first region and at least a portion of the second region are located under the gate electrode.

2. The semiconductor device according to claim 1, further comprising:
a sidewall spacer formed on each of both sidewalls of the gate electrode,
wherein the first semiconductor region is located under the sidewall spacer formed on one of the sidewalls of the gate electrode, and
wherein the second semiconductor region is located under the sidewall spacer formed on the other of the sidewalls of the gate electrode.

3. The semiconductor device according to claim 1, wherein the first region; the second region, the third region, and the fourth region are halo regions.

4. The semiconductor device according to claim 1, wherein a threshold voltage of the MISFET formed on the first region and the third region or on the second region and the fourth region is larger than a threshold voltage of the MISFET formed between the first region and the second region in plan view.

5. The semiconductor device according to claim 1, wherein the first region, the second region, the third region, and the fourth region are formed within 0.5 µm from the element isolation region in the first direction.

6. The semiconductor device according to claim 5, wherein the first region, the second region, the third region, and the fourth region are formed over 0.1 µm or more from the element isolation region.

7. A method of manufacturing a semiconductor device including a MISFET, comprising the steps of:
(a) preparing a semiconductor substrate having a main surface, an element isolation region embedded in a trench of the main surface, and an active region surrounded by the element isolation region;
(b) forming a well region of a first conductivity type in the active region of the semiconductor substrate;
(c) after the (b), forming a gate electrode of the MISFET on the well region of the semiconductor substrate via a gate dielectric film, the gate electrode extending in a first direction;
(d) after the (c), by a first ion implantation, forming a first semiconductor region and a second semiconductor region each having a second conductivity type opposite the first conductivity type in the well region, the first semiconductor region and the second semiconductor region being spaced from each other via a region directly below the gate electrode in a second direction perpendicular to the first direction;
(e) after the (c), by a second ion implantation, forming a first region of the first conductivity type and a second region of the first conductivity type spaced from each other in the second direction in the well region, each of the first region and the second region having an impurity concentration higher than that of the well region;
(f) after the (d) and after the (e), forming a sidewall spacer on each of both sidewalls of the gate electrode; and
(g) after the (f), by a third ion implantation, forming a first high concentration region of the second conductivity type in the well region, the first high concentration region having an impurity concentration higher than that of the first semiconductor region, and forming a second high concentration region of the second conductivity type in the well region, the second high concentration region having an impurity concentration higher than that of the second semiconductor region,
wherein a source region of the MISFET is formed by the first semiconductor region and the first high concentration region,
wherein a drain region of the MISFET is formed by the second semiconductor region and the second high concentration region,
wherein the first region is adjacent to the first semiconductor region, the second region is adjacent to the second semiconductor region, and at least a portion of the first region and at least a portion of the second region are located under the gate electrode, and
wherein the first region and the second region are formed at a vicinity of both end portions of the active region in the first direction, while the first region and the second region are not formed at a center portion of the active region in the first direction.

8. The method according to claim 7, wherein the second ion implantation is an oblique ion implantation.

9. The method according to claim 8, wherein the first ion implantation is a vertical ion implantation.

10. The method according to claim 9, wherein the third ion implantation is a vertical ion implantation.

11. The method according to claim 7, wherein in the (d), the first ion implantation is performed in a state that a first resist pattern is formed on the semiconductor substrate, and
wherein in the (e), the second ion implantation is performed in a state that a second resist pattern different from the first resist pattern is formed on the semiconductor substrate.

12. The method according to claim 11, wherein in the (e), impurity ions by the second ion implantation are implanted into the well region at the vicinity of the both end portions of the active region in the first direction, while impurity ions by the second ion implantation are not implanted into the well region at the center portion of the active region in the first direction by being shielded by the second resist pattern.

13. The method according to claim 7,
wherein the (d) and the (e) are performed in a state that a common resist pattern is formed on the semiconductor substrate.

14. The method according to claim 13,
wherein the common resist pattern is spaced from the gate electrode located on the active region in the second direction,
wherein a distance between the common resist pattern and the gate electrode at the center portion of the active region in the first direction is smaller than a distance between the common resist pattern and the gate electrode at the vicinity of the both end portions of the active region in the first direction.

15. The method according to claim 14,
wherein in the (e), impurity ions by the second ion implantation are implanted into the well region at the vicinity of the both end portions of the active region in the first direction, while impurity ions by the second ion implantation are not implanted into the well region at the center portion of the active region in the first direction by being shielded by the common resist pattern.

16. The method according to claim 7,
wherein an absolute value of a threshold voltage of the MISFET at the vicinity of the both end portions of the active region in the first direction is larger than an absolute value of a threshold voltage of the MISFET at the center portion of the active region in the first direction.

* * * * *